(12) United States Patent
Joe et al.

(10) Patent No.: US 11,450,386 B2
(45) Date of Patent: Sep. 20, 2022

(54) NONVOLATILE MEMORY DEVICE PERFORMING TWO-WAY CHANNEL PRECHARGE

(71) Applicant: Samsung Electronics Co., Ltd., Suwon-si (KR)

(72) Inventors: Sungmin Joe, Seoul (KR); Sangsoo Park, Hwaseong-si (KR); Joonsuc Jang, Hwaseong-si (KR); Kihoon Kang, Hwaseong-si (KR); Yonghyuk Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/221,833

(22) Filed: Apr. 4, 2021

(65) Prior Publication Data
US 2022/0036953 A1   Feb. 3, 2022

(30) Foreign Application Priority Data
Jul. 30, 2020   (KR) .................. 10-2020-0095521

(51) Int. Cl.
*G11C 16/10* (2006.01)
*G11C 16/08* (2006.01)
*G11C 16/24* (2006.01)
*G11C 16/26* (2006.01)
*G11C 16/30* (2006.01)
*G11C 16/32* (2006.01)

(52) U.S. Cl.
CPC ............ *G11C 16/102* (2013.01); *G11C 16/08* (2013.01); *G11C 16/24* (2013.01); *G11C 16/26* (2013.01); *G11C 16/30* (2013.01); *G11C 16/32* (2013.01)

(58) Field of Classification Search
CPC ....... G11C 16/102; G11C 16/08; G11C 16/24; G11C 16/26; G11C 16/30; G11C 16/32; G11C 16/0483; G11C 16/10
See application file for complete search history.

(56) References Cited

U.S. PATENT DOCUMENTS

| | | | | |
|---|---|---|---|---|
| 5,677,873 | A * | 10/1997 | Choi ................. | G11C 16/0483 |
| | | | | 365/185.26 |
| 6,072,721 | A * | 6/2000 | Arase ................ | G11C 16/10 |
| | | | | 365/185.11 |
| 7,508,710 | B2 * | 3/2009 | Mokhlesi .......... | G11C 16/10 |
| | | | | 365/185.28 |
| 8,891,314 | B2 | 11/2014 | Park | |

(Continued)

*Primary Examiner* — Jay W. Radke
(74) *Attorney, Agent, or Firm* — Muir Patent Law, PLLC

(57) ABSTRACT

A nonvolatile memory device that performs two-way channel precharge during programming is provided. A program operation of the nonvolatile memory device simultaneously performs a first precharge operation in a bit line direction and a second precharge operation in a source line direction on channels of a plurality of cell strings before programming a selected memory cell to initialize the channels. The first precharge operation precharges the channels of the plurality of cell strings using a first precharge voltage applied to the bit line through first and second string selection transistors, and the second precharge operation precharges the channels of the plurality of cell strings using a second precharge voltage applied to the source line through first and second ground selection transistors.

20 Claims, 23 Drawing Sheets

(56) References Cited

U.S. PATENT DOCUMENTS

| | | | |
|---|---|---|---|
| 8,987,832 B2 | 3/2015 | Park et al. | |
| 8,988,937 B2 | 3/2015 | Dunga et al. | |
| 9,053,797 B2 | 6/2015 | Sakui | |
| 9,349,464 B2 | 5/2016 | Shiga et al. | |
| 9,466,369 B1 | 10/2016 | Pang et al. | |
| 9,595,319 B2 | 3/2017 | Lee | |
| 9,754,673 B2 | 9/2017 | Park et al. | |
| 9,875,800 B2 | 1/2018 | Lee | |
| 9,875,801 B2* | 1/2018 | Koval | G11C 16/0483 |
| 10,510,771 B2 | 12/2019 | Nam et al. | |
| 10,541,033 B2 | 1/2020 | Jung et al. | |
| 10,566,059 B2 | 2/2020 | Diep et al. | |
| 2004/0240269 A1* | 12/2004 | Cernea | G11C 16/24 365/185.12 |
| 2005/0057965 A1* | 3/2005 | Cernea | G11C 16/3427 365/177 |
| 2005/0174852 A1* | 8/2005 | Hemink | G11C 16/0483 365/185.28 |
| 2005/0213385 A1* | 9/2005 | Hosono | G11C 16/08 365/185.17 |
| 2005/0226055 A1* | 10/2005 | Guterman | G11C 16/12 365/185.28 |
| 2005/0248988 A1* | 11/2005 | Guterman | G11C 16/30 365/185.28 |
| 2005/0248989 A1* | 11/2005 | Guterman | G11C 16/0483 365/185.28 |
| 2005/0276108 A1* | 12/2005 | Guterman | G11C 16/0483 365/185.18 |
| 2006/0071264 A1* | 4/2006 | Hemink | H01L 27/115 257/E21.422 |
| 2006/0198195 A1* | 9/2006 | Hemink | G11C 16/12 365/185.18 |
| 2006/0221683 A1* | 10/2006 | Chen | G11C 11/5628 365/185.03 |
| 2006/0221692 A1* | 10/2006 | Chen | G11C 11/5642 365/185.11 |
| 2006/0221714 A1* | 10/2006 | Li | G11C 11/5642 365/210.1 |
| 2006/0227613 A1* | 10/2006 | Joo | G11C 16/3418 365/185.18 |
| 2006/0250850 A1* | 11/2006 | Lee | G11C 16/3427 365/185.18 |
| 2007/0047314 A1* | 3/2007 | Goda | G11C 16/0483 365/185.18 |
| 2007/0086247 A1* | 4/2007 | Lutze | G11C 16/3427 365/185.18 |
| 2007/0086251 A1* | 4/2007 | Lutze | G11C 7/12 365/195 |
| 2007/0133286 A1* | 6/2007 | Walker | G11C 16/3427 365/185.17 |
| 2007/0159886 A1* | 7/2007 | Kang | G11C 16/0483 365/185.17 |
| 2007/0166918 A1* | 7/2007 | Oh | G11C 16/0483 438/257 |
| 2007/0236992 A1* | 10/2007 | Oowada | G11C 16/12 257/E27.103 |
| 2007/0236993 A1* | 10/2007 | Oowada | G11C 16/12 257/E27.103 |
| 2007/0247909 A1* | 10/2007 | Kamei | G11C 16/3427 365/185.23 |
| 2007/0297247 A1* | 12/2007 | Hemink | G11C 16/12 365/195 |
| 2008/0055995 A1* | 3/2008 | Ito | G11C 16/12 365/185.28 |
| 2008/0089128 A1* | 4/2008 | Mokhlesi | H01L 27/115 257/E21.205 |
| 2008/0117683 A1* | 5/2008 | Hemink | G11C 11/5621 365/185.18 |
| 2008/0117684 A1* | 5/2008 | Hemink | G11C 11/5628 365/185.19 |
| 2008/0123425 A1* | 5/2008 | Lutze | G11C 16/3418 365/185.17 |
| 2008/0123426 A1* | 5/2008 | Lutze | G11C 16/3418 365/185.17 |
| 2008/0130360 A1* | 6/2008 | Kim | G11C 16/0483 365/185.23 |
| 2008/0137425 A1* | 6/2008 | Dong | G11C 16/3427 365/185.18 |
| 2008/0137426 A1* | 6/2008 | Dong | G11C 16/3418 365/185.18 |
| 2010/0046294 A1* | 2/2010 | Jeong | G11C 16/0483 365/185.11 |
| 2013/0250697 A1 | 9/2013 | Park | |
| 2014/0211563 A1* | 7/2014 | Chang | G11C 16/3427 365/185.03 |
| 2016/0071592 A1* | 3/2016 | Nam | G11C 16/16 365/185.12 |
| 2016/0372201 A1* | 12/2016 | Moschiano | G11C 16/0483 |
| 2019/0378574 A1 | 12/2019 | Lee et al. | |
| 2020/0119045 A1 | 4/2020 | Nam et al. | |
| 2020/0143890 A1* | 5/2020 | Lee | G11C 16/16 |
| 2020/0402584 A1* | 12/2020 | Lee | G11C 16/10 |
| 2021/0125672 A1* | 4/2021 | Wei | G11C 16/3418 |
| 2022/0036953 A1* | 2/2022 | Joe | G11C 16/102 |
| 2022/0101921 A1* | 3/2022 | Lee | G11C 16/08 |

* cited by examiner

NONVOLATILE MEMORY DEVICE PERFORMING TWO-WAY CHANNEL PRECHARGE

CROSS-REFERENCE TO RELATED APPLICATION

This application claims priority under 35 U.S.C. § 119 to Korean Patent Application No. 10-2020-0095521, filed on Jul. 30, 2020, in the Korean Intellectual Property Office, the disclosure of which is incorporated by reference herein in its entirety.

BACKGROUND

The present disclosure relates to a semiconductor memory device, and more particularly, to a nonvolatile memory device that performs two-way channel precharge during programming and a program method thereof.

Semiconductor memory devices are used to store data, and are classified into volatile memory devices and nonvolatile memory devices. As an example of a nonvolatile memory device, a flash memory device is used in a universal serial bus (USB) memory, a digital camera, a mobile phone, a smart phone, a tablet PC, a memory card, and a solid state drive (SSD). In order to improve the storage capacity and degree of integration of a memory, a nonvolatile memory device in which memory cells are stacked in a three-dimensional (3D) structure, for example, a 3D NAND flash memory, has been researched.

In the 3D NAND flash memory, a plurality of program loops may be performed until the program is completed according to incremental step pulse programming (hereinafter referred to as "ISPP"). As the program loops increase, the program voltage of a selected memory cell may increase step by step. In order to reduce program disturb, a program operation may have a program order in which memory cells located in an upper portion of a cell string are first programmed. Before performing the program loop on the selected memory cell, initialization or a precharge (hereinafter referred to as unselect string initial precharge (USIP)) operation may be performed on channels of a plurality of cell strings. However, when the memory cells located in the upper portion of the cell string are in a programmed state, the USIP operation on the cell string may not be possible due to some of the channels corresponding to the programmed memory cells may be negatively boosted, and the programmed memory cells have high threshold voltage. There can be program disturb problems and/or hot carrier injection problems that seriously affects the memory cells arranged in the cell string.

According to the trend of large capacity of memory blocks, it is not easy to provide performance appropriate for increased capacity with existing control techniques or algorithms. Accordingly, a memory controller may manage the memory block as a plurality of small sub-blocks by dividing one memory block into a word line unit and. For example, the memory controller may not erase the memory block in one memory block unit but may erase the memory block in a sub-block unit. Besides, the program order of the cell string may be set in the sub-block unit.

Even though the cell string is programmed in the sub-block unit by using a block management method of the memory controller, if the USIP operation is performed on the cell string regardless of the programmed memory cells, and if such a facility is possible, it may be beneficial to improve the program performance.

SUMMARY

The present disclosure provides a nonvolatile memory device capable of improving program performance by performing two-way channel precharge during programming and a program method thereof.

According to an aspect of the inventive concept, there is provided a program method of a nonvolatile memory device including a plurality of cell strings connected between a plurality of bit lines and a source line, each cell string including a first string selection transistor, a second string selection transistor, a plurality of memory cells, a second ground selection transistor, and a first ground selection transistor being arranged in series between a bit line and the source line, the program method including: initializing channels with respect to the plurality of cell strings; and performing a program operation on a selected memory cell among the plurality of memory cells. The initializing of the channels includes performing a first precharge on the channels of the plurality of cell strings using a first precharge voltage applied to the bit lines through the first and second string selection transistors; performing a second precharge on the channels of the plurality of cell strings using a second precharge voltage applied to the source line through the first and second ground selection transistors; applying a ground voltage or a first negative voltage lower than the ground voltage to a first string selection line connected to the first string selection transistor; applying the ground voltage to a second string selection line connected to the second string selection transistor; applying the ground voltage to a second ground selection line connected to the second ground selection transistor; and applying the ground voltage or a second negative voltage lower than the ground voltage to a first ground selection line connected to the first ground selection transistor. The first precharge is performed simultaneously with the second precharge.

According to another aspect of the inventive concept, there is provided a program method of a nonvolatile memory device including a plurality of cell strings connected between a plurality of bit lines and a source line, each cell string including a first string selection transistor, a second string selection transistor, a plurality of memory cells, a second ground selection transistor, and a first ground selection transistor being arranged in series between a bit line and the source line, the program method including: initializing channels with respect to the plurality of cell strings; and performing a program operation on a selected memory cell among the plurality of memory cells. The initializing of the channels includes applying a word line voltage having a power voltage applied to the nonvolatile memory device to one or more word lines of programmed memory cells among the plurality of memory cells; performing a first precharge on the channels of the plurality of cell strings using a first precharge voltage applied to the bit lines through the first and second string selection transistors; and performing a second precharge on the channels of the plurality of cell strings using a second precharge voltage applied to the source line through the first and second ground selection transistors. The first precharge is performed simultaneously with the second precharge. The power voltage is greater than a ground voltage, and the first precharge voltage and the second precharge voltage are greater than the power voltage.

According to another aspect of the inventive concept, there is provided a nonvolatile memory device including a memory cell array including a plurality of cell strings connected between a plurality of bit lines and a source line, each cell string including a first string selection transistor, a second string selection transistor, a plurality of memory cells, a second ground selection transistor, and a first ground selection transistor being arranged in series between a bit line and the source line; and a control circuit configured to perform an operation of initializing channels with respect to the plurality of cell strings and a program operation on a selected memory cell among the plurality of memory cells. The control circuit is configured, in the operation of initializing the channels, to perform a first precharge on the channels of the plurality of cell strings using a first precharge voltage applied to the bit lines through the first and second string selection transistors; and to simultaneously perform a second precharge with the first precharge on the channels of the plurality of cell strings using a second precharge voltage applied to the source line through the first and second ground selection transistors. The first precharge voltage and the second precharge voltage are greater than a power voltage applied to the nonvolatile memory device. The power voltage is greater than the ground voltage.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
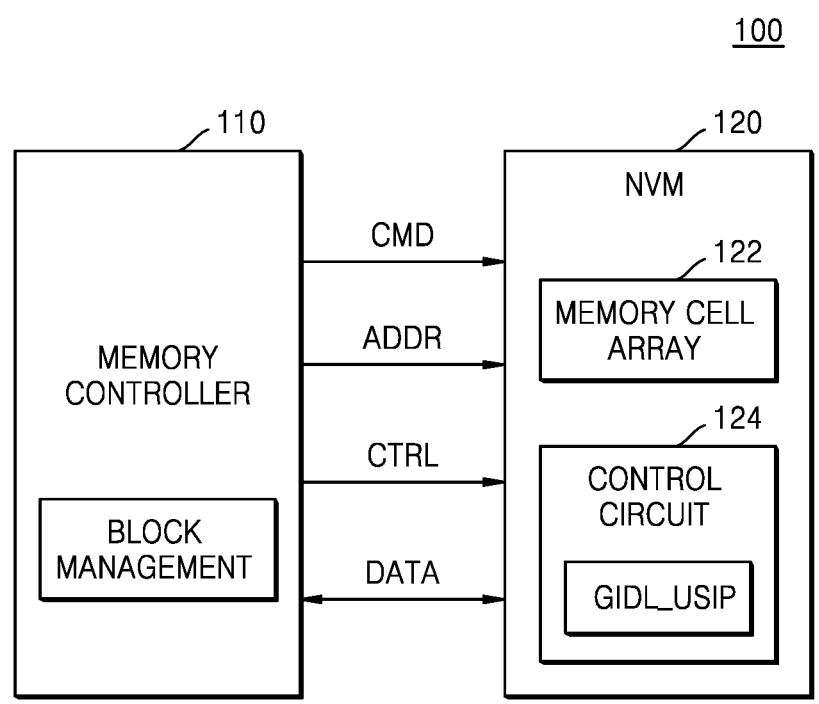
FIG. 1 is a block diagram illustrating a memory system according to example embodiments.

FIG. 1 is a block diagram illustrating a memory system 100 according to example embodiments.

Referring to FIG. 1, the memory system 100 may include a memory controller 110 and at least one memory device 120. The memory device 120 illustrated in FIG. 1 may be a nonvolatile memory device such as a flash memory device, and the memory system 100 may include a data storage medium such as a universal serial bus (USB) memory, a memory card, and a solid state drive (SSD).

The memory device 120 may perform an erase, program, or read operation under the control of the memory controller 110. The memory device 120 may receive a command CMD and an address ADDR from the memory controller 110 through an input/output line, transmit and receive data DATA for the program operation or the read operation with the memory controller 110. Also, the memory device 120 may receive a control signal CTRL through a control line. The memory device 120 may include a memory cell array 122 and a control circuit 124.

The memory cell array 122 may include a plurality of memory blocks, and each of the plurality of memory blocks may include a plurality of memory cells. For example, the plurality of memory cells may be flash memory cells. Hereinafter, embodiments of the present disclosure will be described in detail by taking a case where the plurality of memory cells are NAND flash memory cells as an example. The memory cell array 122 may include a 3D memory cell array including a plurality of cell strings, which will be described in detail with reference to FIGS. 3 and 4.

The 3D memory cell array is monolithically formed on at least one physical level of memory cell arrays having an active region disposed on a silicon substrate and a circuit related to the operation of the memory cells and formed on or in the substrate. The term "monolithic" means that layers of each level constituting the array are stacked directly on layers of each lower level of the array. In an embodiment according to the inventive concept, the 3D memory cell array includes cell strings arranged in a vertical direction such that at least one memory cell is positioned on another memory cell. The at least one memory cell may include a charge trap layer. U.S. Pat. Nos. 7,679,133 B2, 8,553,466 B2, 8,654,587 B2, 8,559,235 B2, and U.S. Patent Application Publication No. 2011/0233648 A1 describe suitable configurations of a 3D memory cell array constituting a plurality of levels and sharing word lines and/or bit lines between levels, and are incorporated by reference herein.

The memory controller 110 may divide one memory block in the memory cell array 122 of the memory device 120 into a word line unit and manage the memory block as a plurality of small sub-blocks. The sub-blocks of the memory block will be described in detail with reference to FIGS. 18A and 18C.

The control circuit 124 may initialize channels with respect to the plurality of cell strings in the memory cell array 122 and may perform the program operation on a selected memory cell among the plurality of memory cells.

Figure 2:
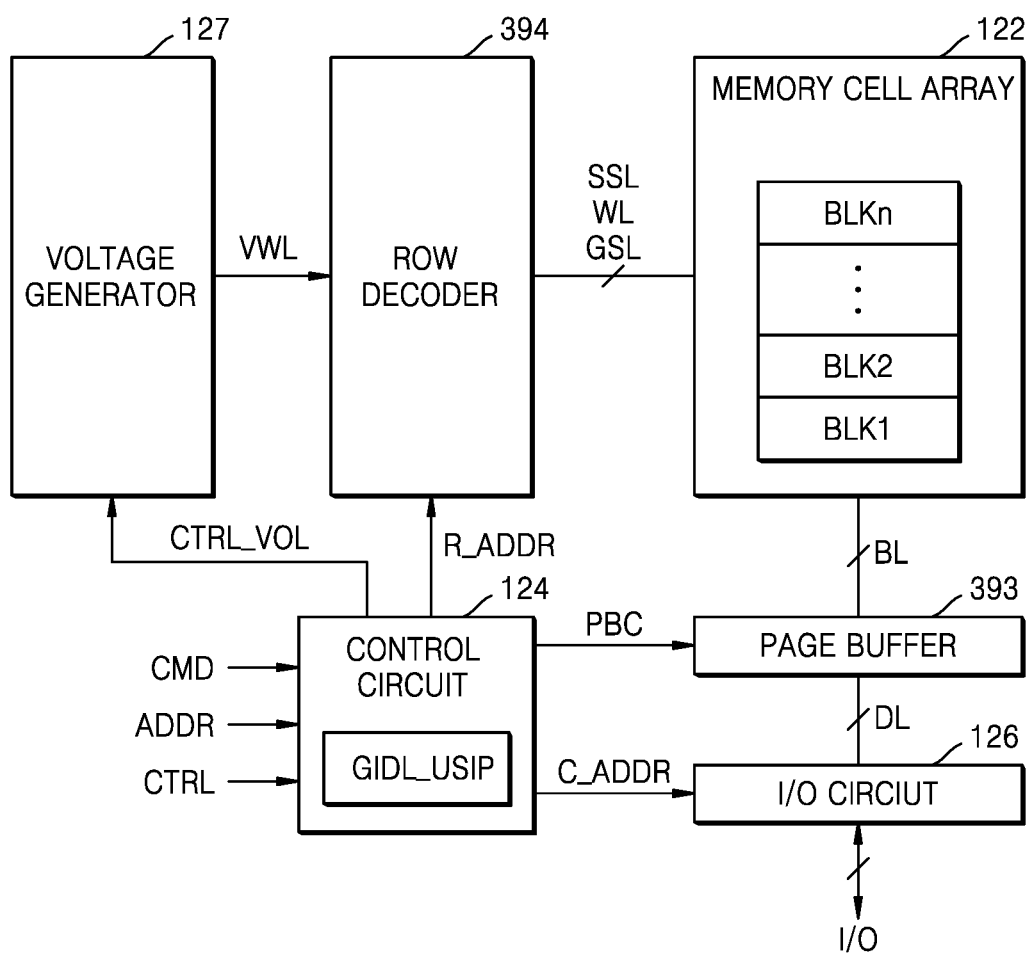
FIG. 2 is a block diagram illustrating a memory device of FIG. 1 according to example embodiments.

FIG. 2 is a block diagram illustrating the memory device 120 of FIG. 1 according to example embodiments.

Referring to FIG. 2, the memory device 120 (e.g., nonvolatile memory device) may include the memory cell array 122, a row decoder 394, the control circuit 124, a page buffer 393, an input/output (I/O) circuit 126, and a voltage generator 127. Although not shown, the memory device 120 may further include an input/output interface.

The memory cell array 122 may be connected to word lines WL, string selection lines SSL, ground selection lines GSL, and bit lines BL. The memory cell array 122 may be connected to the row decoder 394 through the word lines WL, the string selection lines SSL, and the ground selection lines GSL, and may be connected to the page buffer 393 through the bit lines BL. The memory cell array 122 may include a plurality of memory blocks BLK1 to BLKn.

Each of the memory block BLK1 to BLKn may include a plurality of memory cells and a plurality of selection transistors. The memory cells may be connected to the word lines WL, and the selection transistors may be connected to the string selection lines SSL or the ground selection lines GSL. The memory cells of each of the memory blocks BLK1 to BLKn may include single-level cells storing 1-bit data or multi-level cells storing M-bit data (M is an integer equal to or greater than 2).

The row decoder 394 may select one of the plurality of memory blocks BLK1 to BLKn of the memory cell array 122, select one of the word lines WL of the selected memory block, and may select one of the string selection lines SSL.

The control circuit 124 may output various internal control signals for performing program, read, and erase operations on the memory cell array 122 based on a command CMD, an address ADDR, and a control signal CTRL transmitted from the memory controller 110. The control circuit 124 may provide a row address R_ADDR to the row decoder 394, may provide a column address C_ADDR to the I/O circuit 126, and may provide a voltage control signal CTRL_VOL to the voltage generator 127.

The control circuit 124 may first precharge on channels of the plurality of cell strings using a first precharge voltage of the bit line BL through first and second string selection transistors, second precharge the channels of the plurality of cell strings using a second precharge voltage of a source line through first and second ground selection transistors, and simultaneously perform the first precharge and the second precharge before programming the selected memory cell.

The page buffer 393 may operate as a write driver or a sense amplifier according to a page buffer control signal PBC. During the read operation, the page buffer 393 may sense the bit line BL of the selected memory cell under the control of the control circuit 124. Sensed data may be stored in latches provided in the page buffer 393. The page buffer 393 may dump the data stored in the latches to the I/O circuit 126 through a data line DL under the control of the control circuit 124.

The I/O circuit 126 may temporarily store the command CMD, the address ADDR, and the data DATA provided from the outside of the memory device 120 through the input/output line I/O. The I/O circuit 126 may temporarily store read data from the memory cell array 122 and output the data to the outside of the memory device 120 through an input/output line (I/O) at a designated time.

The voltage generator 127 may generate various types of voltages for performing the program, read, and erase operations on the memory cell array 122 based on the voltage control signal CTRL_VOL. Specifically, the voltage generator 127 may generate a word line voltage VWL, for example, a program voltage, a verification read voltage, a read voltage, a pass voltage, an erase voltage, an erase verification voltage, and the like. Also, the voltage generator 127 may generate first to third precharge voltages $V_{GIDL\_BL}$, and $V_{GIDL\_CSL}$, and VPC based on the voltage control signal CTRL_VOL.

Figure 3:
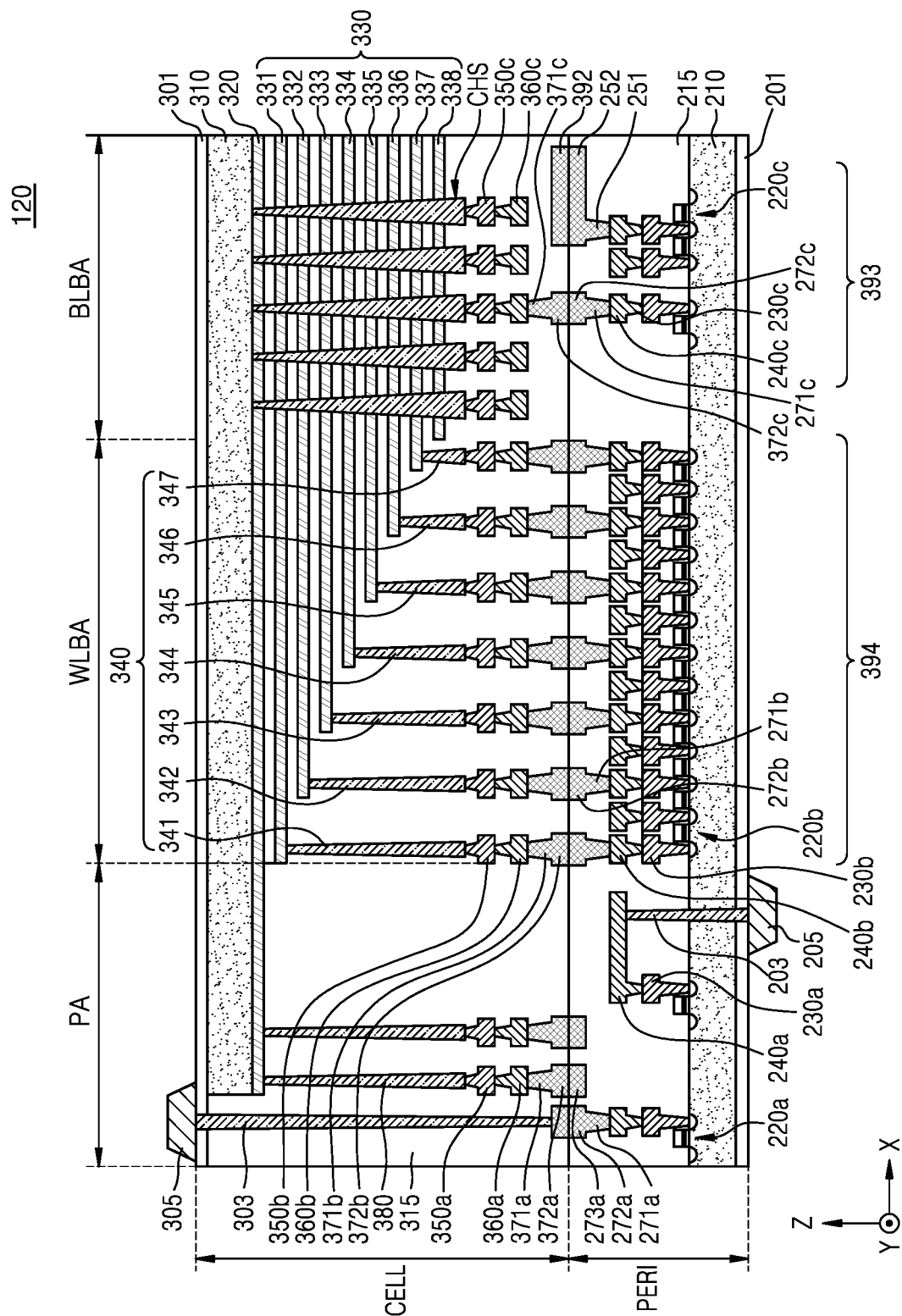
FIG. 3 is a cross-sectional view illustrating the memory device of FIG. 2 according to example embodiments.

FIG. 3 is a cross-sectional view illustrating the memory device 120 of FIG. 2 according to an example embodiment.

Referring to FIG. 3, a memory device 120 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 120 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. Each of the circuit elements 220a, 220b, and 220c may include one or more transistors. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrated in FIG. 3, although only the first metal layers 230a, 230b, and 230c and the second metal layers 240a, 240b, and 240c are shown and described, the invention is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like.

Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CHS may extend in a direction(a Z-axis direction), perpendicular to the upper surface of the second substrate 310, and pass through the plurality of word lines 330, the at least one string select line, and the at least one ground select line. The channel structure CHS may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 3, an area in which the channel structure CHS, the bit line 360c, and the like are disposed may be defined as the bit line bonding area BLBA. In the bit line bonding area BLBA, the bit line 360c may be electrically connected to the circuit elements 220c providing the page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming the row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 3, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 3, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to example embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 3, the second input-output contact plug 303 may be separated from the second substrate 310 in a direction, parallel to the upper surface of the second substrate 310, and may pass through an interlayer insulating layer 315 of the cell region CELL to be connected to the second input-output pad 305.

According to example embodiments, the first input-output pad 205 and the second input-output pad 305 may be selectively formed. For example, the memory device 120 may include only the first input-output pad 205 disposed on the first substrate 210 or the second input-output pad 305 disposed on the second substrate 310. Alternatively, the memory device 120 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 120 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In example embodiments, the memory cell region CELL may correspond to the memory cell array 122 in FIG. 1. In example embodiments, the peripheral circuit region PERI may correspond to the row decoder 394, voltage generator 127, control circuit 124, page buffer 393 and I/O circuit 126 in FIG. 2.

Figure 4:
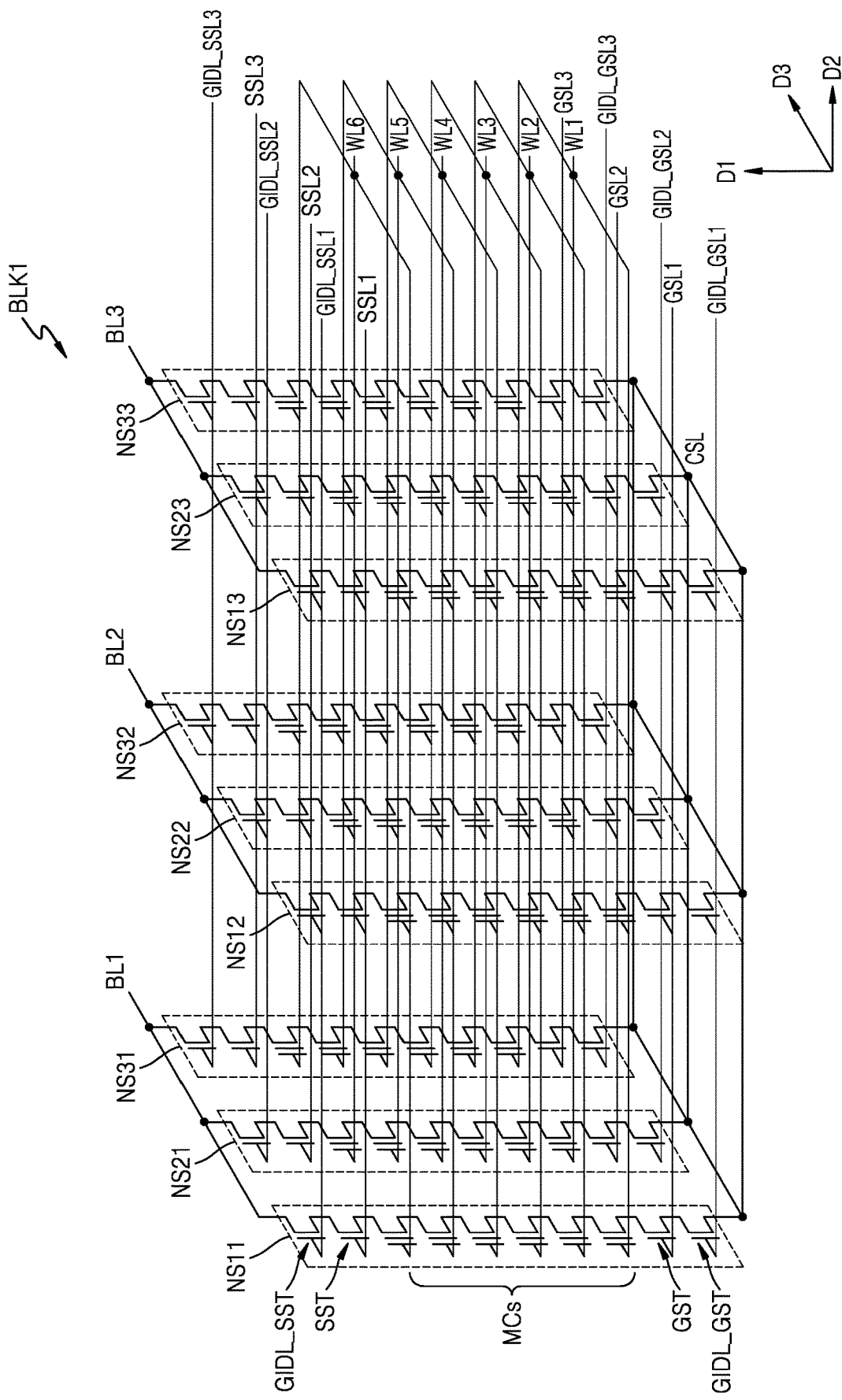
FIG. 4 is an equivalent circuit diagram of a memory block of FIG. 2 according to example embodiments.

FIG. 4 is an equivalent circuit diagram of a memory block of FIG. 2 according to example embodiments. The memory block illustrated in FIG. 4 is an example of one of the plurality of memory blocks BLK1 to BLKn described with reference to FIG. 2, and shows the first memory block BLK1. The first memory block BLK1 represents a 3D memory block formed in a 3D structure on a substrate. A plurality of memory cell strings included in the first memory block BLK1 may be formed in a direction D1 perpendicular to the substrate.

Referring to FIG. 4, the first memory block BLK1 may include cell strings NS11 to NS13, NS21 to NS23, and NS31 to NS33, word lines WL1 to WL6, bit lines BL1 to BL3, first ground selection lines GIDL_GSL1 to GIDL_GSL3, second ground selection lines GSL1 to GSL3, first string selection lines GIDL_SSL1 to GIDL_SSL3, second string selection lines SSL1 to SSL3, and a source line CSL. In FIG. 4, each of the cell strings NS11 to NS13, NS21 to NS23, and NS31 to NS33 includes six memory cells MCs respectively connected to six word lines WL1 to WL6, but the invention is not limited thereto.

Each cell string (e.g., NS11) may include a first string selection transistor GIDL_SST, a second string selection transistor SST, a plurality of memory cells MCs, a first ground selection transistor GIDL_GST and a second ground selection transistor GST. The first string selection transistor GIDL_SST may be connected to the first string selection line GIDL_SSL1 corresponding thereto, and the second string selection transistor SST may be connected to the second string selection line SSL1 corresponding thereto. The plurality of memory cells MC may be respectively connected to the word lines WL1 to WL6 corresponding thereto. The first ground selection transistor GIDL_GST may be connected to the first ground selection line GIDL_GSL1 corresponding thereto, and the second ground selection transistor GST may be connected to the second ground selection line GSL1 corresponding thereto. The first string selection transistor GIDL_SST may be connected to the corresponding bit line BL1 corresponding thereto, and the first ground selection transistor GIDL_GST may be connected to the source line CSL.

Figure 18A:
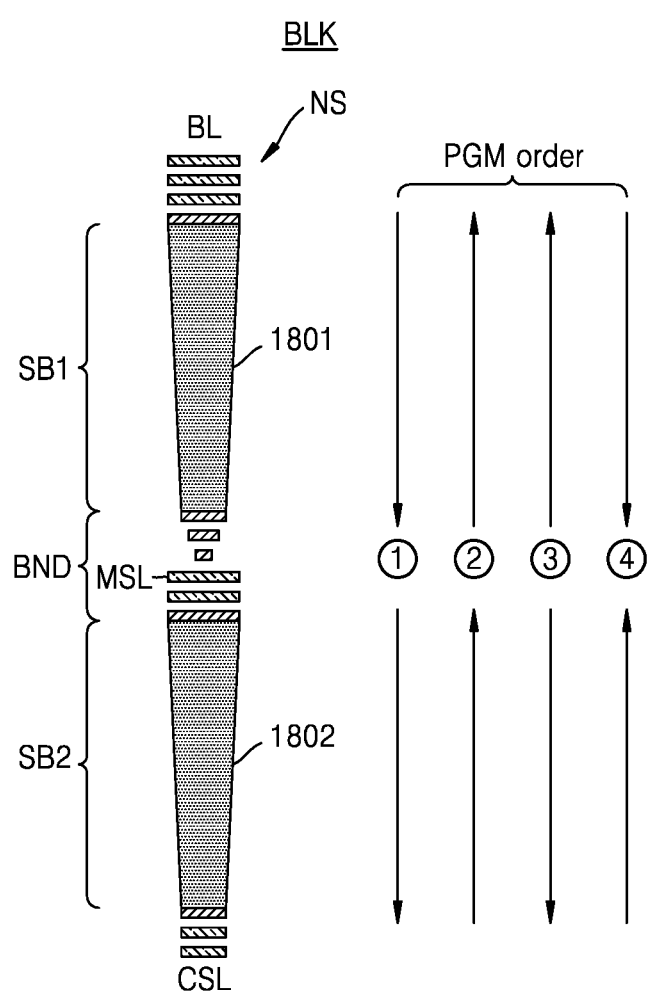
FIGS. 18A to 18C are diagrams illustrating a state of a sub-block in a memory block during a program operation of a memory device according to example embodiments.
Figure 18B:
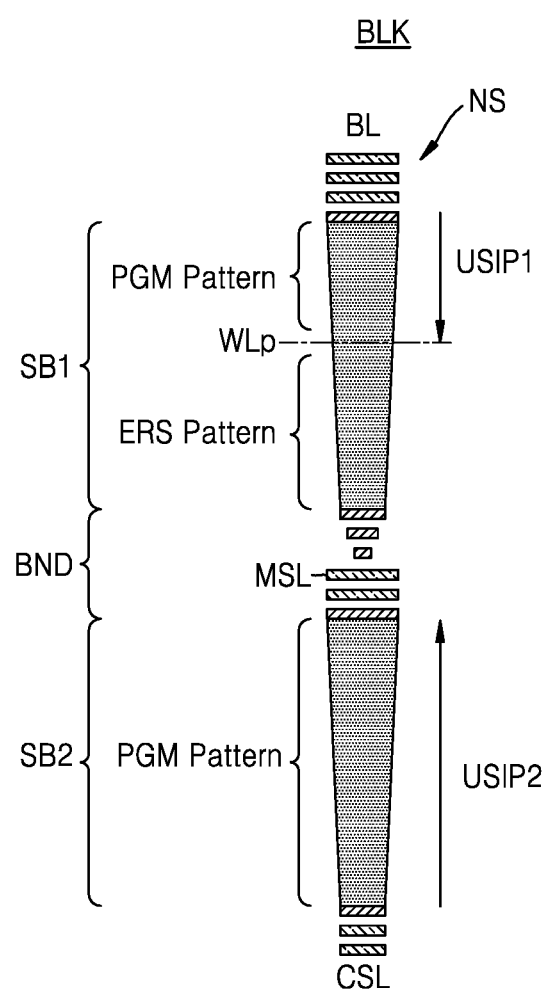
Figure 18C:
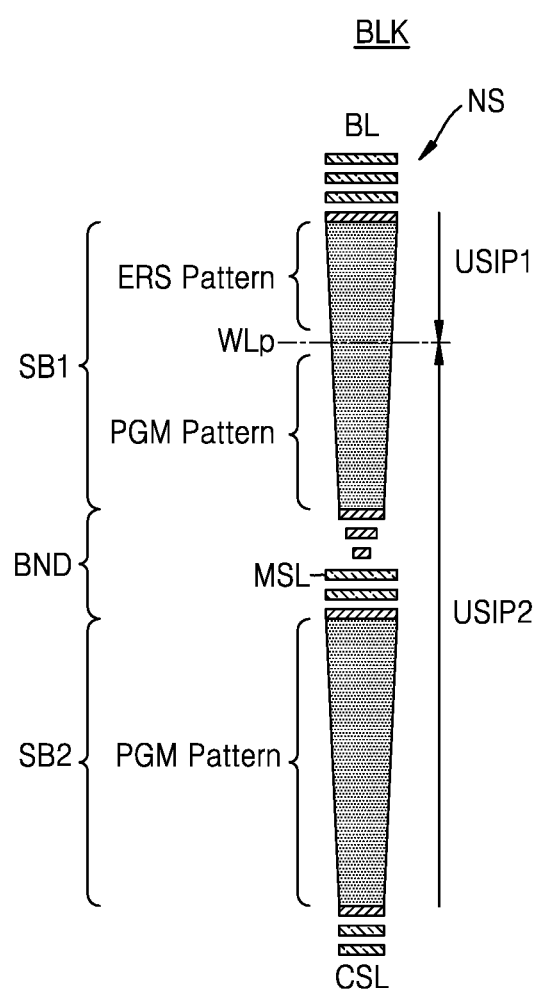

The word line (e.g., WL1) having the same height in the cell strings NS11 to NS13, NS21 to NS23, and NS31 to NS33 may be connected in common, and the first ground selection lines GIDL_GSL1, GIDL_GSL2, and GIDL_GSL3, the second ground selection lines GSL1, GSL2, and GSL3, the first string selection lines GIDL_SSL1, GIDL_SSL2, and GIDL_SSL3, and the second string selection lines SSL1, SSL2, and SSL3 may be separated. The cell strings NS11 to NS13, NS21 to NS23, and NS31 to NS33 may include a word line corresponding to a middle switching line among a plurality of word lines as shown in FIGS. 18A to 18C that will be described later. The middle switching line may be used as a reference for dividing one memory block into a plurality of sub-blocks.

Figure 5:
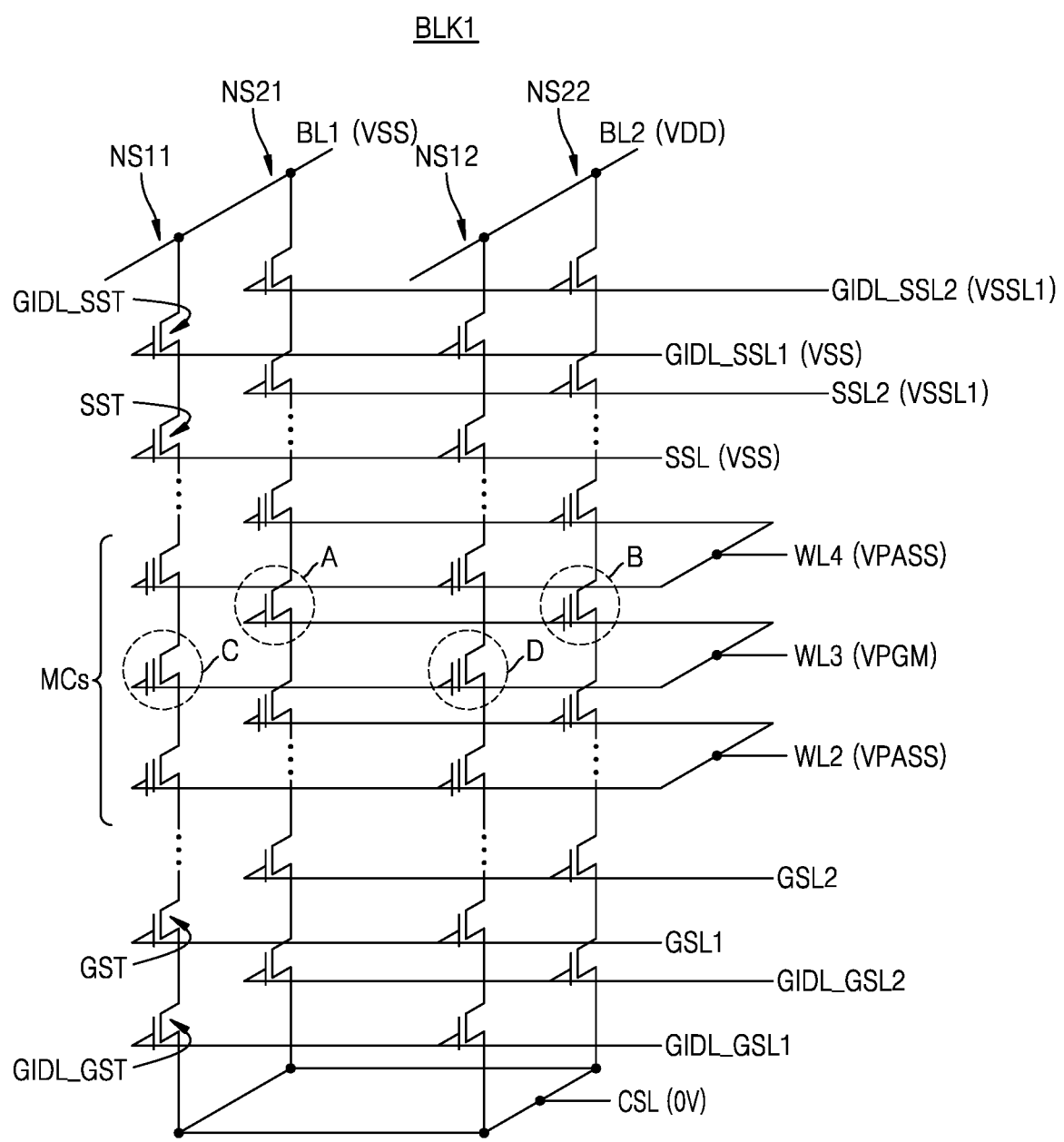
FIG. 5 is a diagram illustrating an exemplary program bias condition of the memory block of FIG. 4 according to example embodiments.

FIG. 5 is a diagram illustrating an exemplary program bias condition of the memory block of FIG. 4 according to example embodiments. FIG. 5 illustrates, for convenience, the cell strings NS11 and NS21 connected to the first bit line BL1 among the cell strings NS11 to NS13, NS21 to NS23, and NS31 to NS33 of the first memory block BLK1 and the cell strings NS12 and NS22 connected to the second bit line BL2.

Referring to FIG. 5, the first bit line BL1 is a program permission bit line to which a relatively low program permission voltage VPER (FIGS. 7A and 7B), for example, a ground voltage VSS, is applied, and the second bit line BL2 is a program inhibition bit line to which a relatively high program inhibition voltage VINH (FIGS. 7A and 7B), for example, a power voltage VDD, is applied. For example, the program permission bit line may correspond to a selected cell string and the program inhibition bit line may correspond to a non-selected cell string.

Assuming that the cell string NS21 is selected from among the cell strings NS11 and NS21 connected to the first bit line BL1, during a program operation PROGRAM (FIGS. 7A and 7B), a turn-off voltage of the ground voltage VSS level may be applied to the first and second string selection lines GIDL_SSL1 and SSL1 connected to the cell string NS11, and a turn-on voltage VSSL1 (FIGS. 7A and 7B) equal to or greater than a threshold voltage Vth of each of the first and second string selection transistors GIDL_SST and SST, for example, the power voltage VDD, may be applied to the first and second string selection lines GIDL_SSL2 and SSL2 connected to the cell string NS21.

A turn-off voltage of the ground voltage VSS level is applied to the first ground selection lines GIDL_GSL1 and GIDL_GSL2 and the second ground selection lines GSL1 and GSL2. A third precharge voltage VPC (FIGS. 7A and 7B) higher than the ground voltage VSS and lower than the power voltage VDD may be applied to the source line CSL. A program voltage VPGM (FIGS. S 7A and 7B) (e.g., 18V) is applied to the selected word line (e.g., WL3), and a program pass voltage VPASS1 (FIGS. 7A and 7B) is applied to the non-selected word lines (e.g., WL2 and WL4).

Under this program bias condition, for example, 18V is applied to a gate of the memory cell A and a channel voltage is 0V. Because a strong electric field is formed between the gate and the channel of the memory cell A, the memory cell A may be programmed. Because the channel voltage of the memory cell B is the power voltage VDD and a weak electric field is formed between the gate and the channel of the memory cell B, the memory cell B may be not programmed. Because channels of the memory cells C and D are in a floating state, the channel voltage rises to a boosting level by the program pass voltage VPASS1, and the memory cells C and D may be not programmed.

Figure 6:
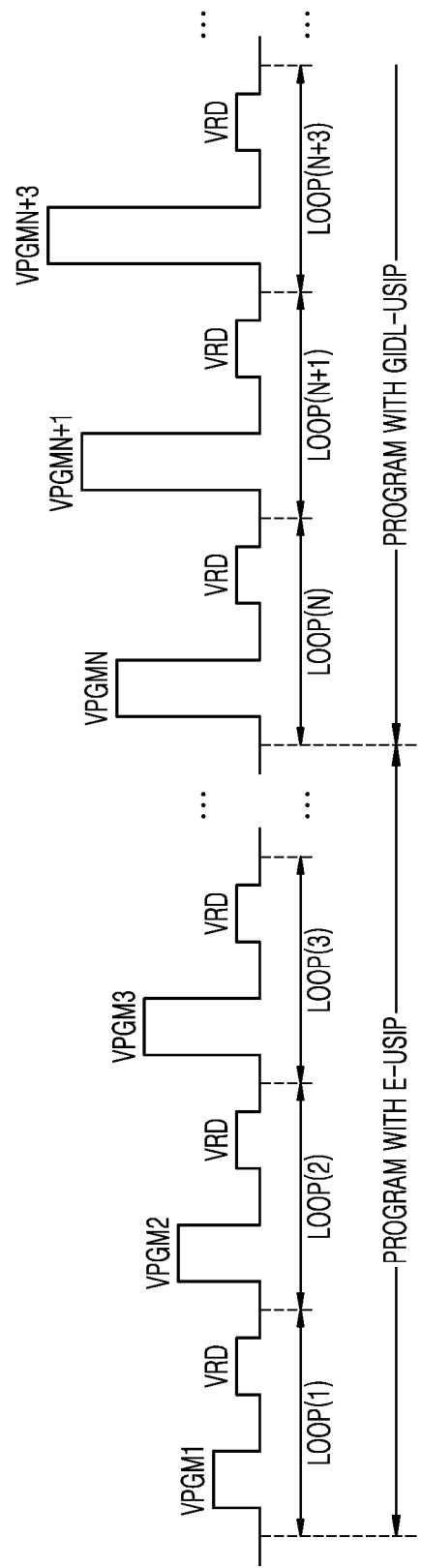
FIG. 6 is a diagram illustrating a program method of a memory device according to example embodiments.

FIG. 6 is a diagram illustrating a program method of a memory device according to example embodiments. FIG. 6 shows a plurality of program loops LOOP(1), LOOP(2), LOOP(3), . . . and LOOP(N+3) for incremental step pulse programming (ISPP).

Referring to FIG. 6, the plurality of program loops LOOP(1), LOOP(2), LOOP(3), . . . and LOOP(N+3) may be sequentially performed until program is completed according to ISPP. As the program loop is repeated, the program voltages VPGM1, VPGM2, VPGM3, . . . and VPGMN+3 may increase in steps.

Each program loop (LOOP(i), i is a natural number) may include a program period PROGRAM in which program voltages VPGM1, VPGM2, VPGM3, . . . and VPGMN+3 are applied to the selected word line WLs (FIGS. 7A and 7B) to program the selected memory cell and a verification period VERIFY in which a verification read voltage VRD is applied to the selected word line WLs to verify whether program is successful.

In FIG. 6, the N-th program voltage VPGMN applied in the N-th program loop LOOP(N) among the program loops LOOP(i) may act as a criterion for identifying an operation of initializing channels with respect to a plurality of cell strings in the memory cell array 122. The Nth program voltage VPGMN may be selected or changed to a relatively high voltage level. The program operation may change to include a first channel precharge period E-USIP in a program period PRORGRAM of each program loop from the first program loop LOOP(1) to the N-1th program loop LOOP(N-1) and a second channel precharge period GIDL-USIP in a program period of each program loop from the Nth program loop LOOP(N) with respect to the Nth program voltage VPGMN.

Figure 7A:
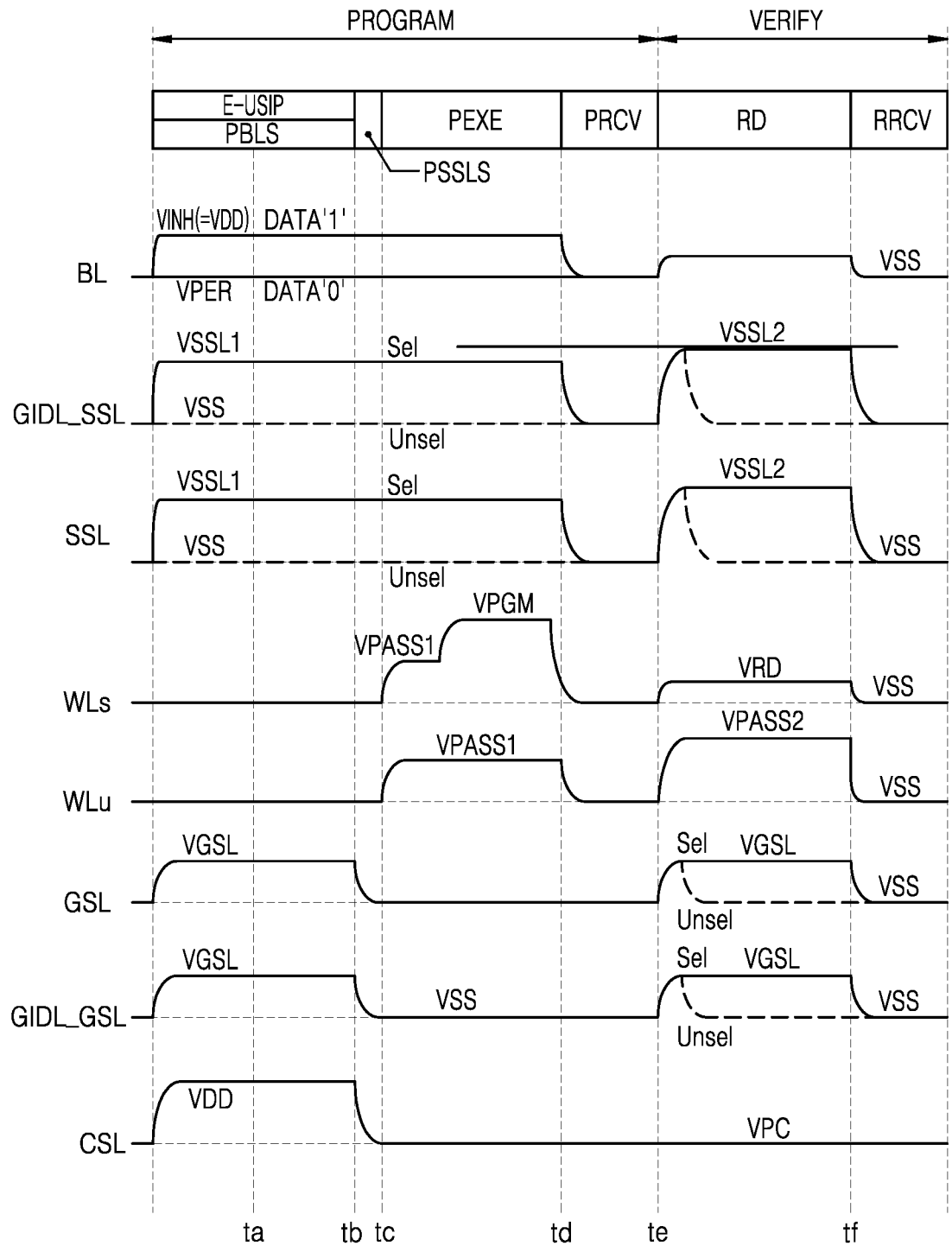
FIGS. 7A and 7B are timing diagrams illustrating a program method of a memory device according to example embodiments.
Figure 7B:
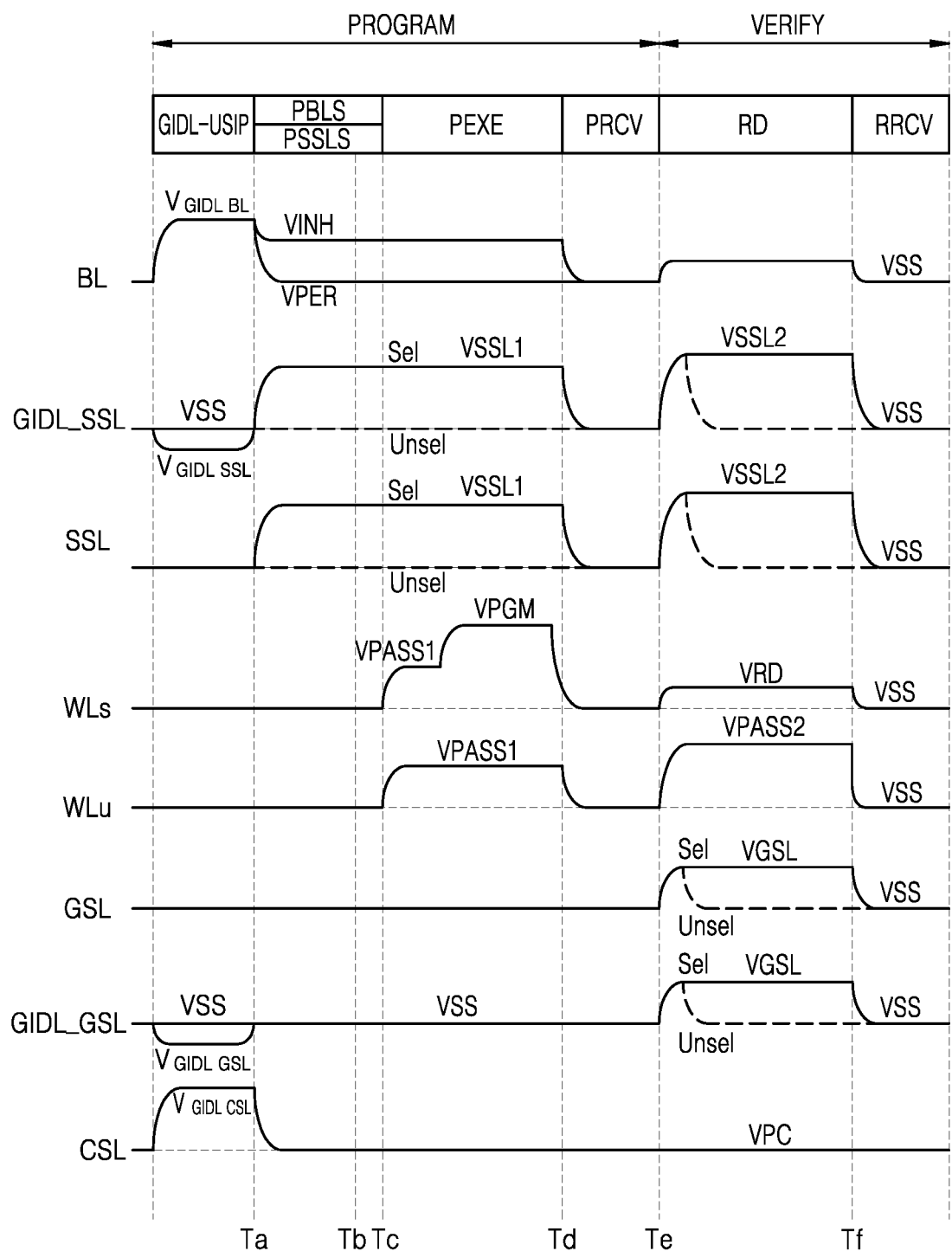

FIGS. 7A and 7B are timing diagrams illustrating a program method of a memory device according to example embodiments. FIG. 7A shows operation periods included in the first program loop LOOP(1) of FIG. 6, and FIG. 7B shows operation periods included in the Nth program loop LOOP(N). It should be noted that the timing diagrams described in the present disclosure are not necessarily drawn to scale.

Referring to FIGS. 5, 6, and 7A, the first program loop LOOP(1) may include the program period PROGRAM in which the program voltage VPGM is applied to the selected word line WLs to program the selected memory cell and the verification period VERIFY in which the verification read voltage VRD is applied to the selected word line WLs to verify whether program is successful. The program period PROGRAM may include the first channel precharge period E-USIP, a bit line setup period PBLS, a string selection line setup period PSSLS, a program execution period PEXE, and a program recovery period PRCV. The verification period VERIFY may include a verification read period RD and a read recovery period RRCV.

Before the string selection line setup period PSSLS, during the first channel precharge period E-USIP and the bit line setup period PBLS, channels of a plurality of cell strings may be initialized or precharged (USIP). The plurality of cell strings may be initialized using the power voltage VDD of both the bit line BL and the source line CSL.

For USIP on the bit line BL side, the power voltage VDD, which is the program inhibition voltage VINH, may be applied to the program inhibition bit line, and the ground voltage VSS, which is a program permission voltage level, may be applied to the program permission bit line. The turn-on voltage VSSL1 may be applied to the selected first string selection line GIDL_SSL and the selected second string selection line SSL, and a turn-off voltage, that is, the ground voltage VSS, may be applied to the non-selected first string selection line GIDL_SSL and the non-selected second string selection line SSL. Accordingly, the channel of the selected cell string among the plurality of cell strings may be initialized through the selected first string selection transistor GIDL_SST and the selected second string selection transistor SST.

For USIP of the source line CSL, the power voltage VDD may be applied to the source line CSL, and a turn-on voltage VGSL may be applied to the first ground selection line GIDL_GSL and the second ground selection line GSL. The power voltage VDD may be referred to as a fourth precharge voltage VCSL. The channels of the plurality of cell strings may be initialized through the first ground selection transistor GIDL_GST and the second ground selection transistor GST.

At a time point to of the first channel precharge period E-USIP and the bit line setup period PBLS, the program inhibition voltage VINH or the program permission voltage VPER may be maintained in the bit line BL according to a value of write data. The turn-on voltage VSSL1 may be maintained in the selected first string selection line GIDL_SSL and the selected second string selection line SSL, and the turn-off voltage may be maintained in the non-selected first string selection line GIDL_SSL and the non-selected second string selection line SSL. The power voltage VDD may be maintained in the source line CSL, and the turn-on voltage VGSL may be maintained in the first ground selection line GIDL_GSL and the second ground selection line GSL.

At a completion time point tb of the bit line setup period PBLS, that is, a start time point tb of the string selection line setup period PSSLS, the turn-off voltage, that is, the ground voltage VSS, may be applied to the source line CSL, the first ground selection line GIDL_GSL, and the second ground selection line GSL.

At a start time point tc of the program execution period PEXE, the program pass voltage VPASS1 may be applied to the selected word line WLs and non-selected word lines WLu, and after a certain period of time elapses, the program voltage VPGM may be applied to the selected word line WLs. During the program execution period PEXE, the selected first string selection line GIDL_SSL and the selected second string selection line SSL are maintained at the turn-on voltage VSSL1, and the non-selected first string selection line GIDL_SSL and the non-selected second string selection line SSL are maintained at the ground voltage VSS.

The program pass voltage VPASS1 applied to the non-selected word lines WLu may be maintained until a completion time point td of the program execution period PEXE, and at this time point, the channel voltage increases according to the self-boosting effect in the cell strings connected to the non-selected word lines WLu.

The memory cells connected to the selected word line WLs of the selected cell string by the program voltage VPGM applied to the selected word line WLs may be programmed according to the setup voltage of the bit line BL. While the program voltage VPGM is applied to the selected word line WLs, the non-selected cell strings maintain a boosting state, and the memory cells connected to the selected word line WLs of the non-selected cell strings are prevented from being programmed.

The bit line BL, the first and second string selection lines GIDL_SSL and SSL, selected word line WLs and the non-selected word lines WLu are recovered to the ground voltage VSS at the completion time point td of the program execution period PEXE, that is, a start time point td of the program recovery period PRCV.

At a start time point to of the verification read period RD, a turn-on voltage VSSL2 may be applied to the selected first string selection line GIDL_SSL and the selected second string selection line SSL and the ground voltage VSS may be maintained in the non-selected first string selection line GIDL_SSL and the non-selected second string selection line SSL. The turn-on voltage VSSL2 of the verification read period RD may have a voltage level higher than that of the turn-on voltage VSSL1 of the program execution period PEXE.

During the verification read period RD, a read pass voltage VPASS2 may be applied to the non-selected word lines WLu and the verification read voltage VRD may be applied to the selected word line WLs. The read pass voltage VPASS2 has a voltage level at which the memory cell is always turned on regardless of the program state of the memory cell. The verification read voltage VRD has a voltage level for determining the threshold voltage level of the selected memory cell.

During the verification read period RD, the turn-on voltage VGSL equal to or higher than the threshold voltage Vth of each of the first and second ground selection transistors GIDL_GST and GST may be applied to the selected first ground selection line GIDL_GSL and the selected second ground selection line GSL and the ground voltage VSS may be applied to the non-selected first ground selection line GIDL_GSL and the non-selected second ground selection line GSL. The first and second ground selection transistors GIDL_GST and GST driven by the selected first ground selection line GIDL_GSL and the selected second ground selection line GSL are turned on, and the first and second ground selection transistors GIDL_GST and GST driven by the non-selected first ground selection line GIDL_GSL and the non-selected second ground selection line GSL are turned off.

During the verification read period RD, the voltage of the bit line BL is developed to a voltage corresponding to data '1' or data '0' according to the threshold voltage state of the selected memory cell. The voltage development of the bit line BL may be sensed to determine a value of data stored in the selected memory cell. Before the start of the verification read period RD, a bit line precharge period in which the voltage levels of all bit lines are precharged to the same voltage level, for example, the power voltage VDD level, may be included.

At a completion time point tf of the verification read period RD, that is, a read recovery time point tf, the turn-off voltage, for example, the ground voltage VSS, may be applied to the selected first ground selection line GIDL_GSL, the selected second ground selection line GSL, the selected first string selection line GIDL_SSL and the selected second string selection line SSL such that the selected first ground selection line GIDL_GSL, the selected second ground selection line GSL, the selected first string selection line GIDL_SSL and the selected second string selection line SSL are recovered to the ground voltage VSS.

For example, the second channel precharge period GIDL-USIP may not be needed in the first program loop LOOP(1) through the N-1th program loop LOOP(N−1). The program disturb may not occur in the first program loop LOOP(1) through the N-1th program loop LOOP(N−1) because a voltage level of the program voltage VPGM in the first program loop LOOP(1) through the N-1th program loop LOOP(N−1) is low.

FIG. 7B shows the operation periods included in the N-th program loop LOOP(N) among the plurality of program loops. Compared with FIG. 7A, timing diagrams from the second channel precharge period GIDL-USIP to the bit line setup period PBLS are different, and the timing diagrams of the remaining periods are the same. Hereinafter, the differences from FIG. 7A will be described.

Referring to FIGS. 5, 6, and 7B, the N-th program loop LOOP(N) may include the program period PROGRAM in which the program voltage VPGM is applied to the selected word line WLs to program the selected memory cell and the verification period VERIFY in which the verification read voltage VRD is applied to the selected word line WLs to verify whether program is successful. The program period PROGRAM may include the second channel precharge period GIDL-USIP, the bit line setup period PBLS, the string selection line setup period PSSLS, the program execution period PEXE, and the program recovery period PRCV. The verification period VERIFY may include the verification read period RD and the read recovery period RRCV.

Before the bit line setup period PBLS, during the second channel precharge period GIDL-USIP, channels of a plurality of cell strings may be initialized or precharged (USIP). The plurality of cell strings may be initialized using the first and second precharge voltages $V_{GIDL\_BL}$ and $V_{GIDL\_CSL}$ of both the bit line BL and the source line CSL. The first and second precharge voltages $V_{GIDL\_BL}$ and $V_{GIDL\_CSL}$ may be set to a voltage level significantly higher than the power voltage VDD.

For USIP on the bit line BL side, the first precharge voltage $V_{GIDL\_BL}$ may be applied to the bit line BL, a first negative voltage $V_{GIDL\_SSL}$ or the ground voltage VSS may be applied to the first string selection line GIDL_SSL, and the ground voltage VSS may be applied to the second string selection line SSL. The first negative voltage $V_{GIDL\_SSL}$ may be set to a voltage level lower than the ground voltage VSS. A high voltage (the first precharge voltage $V_{GIDL\_BL}$) is applied to a drain of the first string selection transistor GIDL_SST, that is, the bit line BL, and a low voltage (the first negative voltage $V_{GIDL\_SSL}$ or the ground voltage VSS) is applied to the gate thereof. Such a great gate-drain voltage difference may induce a GIDL current in the drain side of the first string selection transistor GIDL_SST. The GIDL current may include electron-hole pairs, where electrons are swept to the bit line and holes migrate to the channel to upcharge the channel. At this time, 0V is applied to all the word lines WLs and WLu. When the memory cells on the bit line BL side are already programmed, the threshold voltage Vth of the programmed memory cell may be, for example, about 1 to 3V, and the channel potential may be negatively boosted to 0V or less. The great gate-drain voltage difference of the first string selection transistor GIDL_SST increases the GIDL current and induces the generation of electron-hole pairs to help the generated holes charge up the channel. Accordingly, the channels of the plurality of cell strings may be initialized using the GIDL phenomenon in which current is induced through the first string selection transistor GIDL_SST and the second string selection transistor SST.

For USIP of the source line CSL side, the second precharge voltage $V_{GIDL\_CSL}$ may be applied to the source line CSL, a second negative voltage $V_{GIDL\_GSL}$ or the ground voltage VSS may be applied to the first ground selection line GIDL_GSL, and the ground voltage VSS, which is a turn-off voltage, may be applied to the second ground selection line GSL. The second negative voltage $V_{GIDL\_GSL}$ may be set to a voltage level lower than the ground voltage VSS. A high voltage (the second precharge voltage $V_{GIDL\_CSL}$) is applied to the drain of the first ground selection transistor GIDL_GST, that is, the source line CSL, and a low voltage (the second negative voltage $V_{GIDL\_GSL}$ or the ground voltage VSS) is applied to the gate thereof. This great gate-drain voltage difference may induce the GIDL current in the drain side of the first ground selection transistor GIDL_GST. The great gate-drain voltage difference of the first ground selection transistor GIDL_GST increases the GIDL current and induces the generation of electron-hole pairs to help the generated holes charge up the channel. Accordingly, channels of the plurality of cell strings may be initialized according to the GIDL phenomenon in which current is induced through the first ground selection transistor GIDL_GST and the second ground selection transistor GST.

At a start time point Ta of the bit line setup period PBLS and the string selection line setup period PSSLS, the program inhibition voltage VINH or the program permission voltage VPER may be applied to the bit line BL according to a value of write data. The program inhibition voltage VINH may be at the power voltage VDD level, and the program permission voltage VPER may be at the ground voltage VSS level. The turn-on voltage VSSL1 equal to or higher than the threshold voltage Vth of each of the first and second string selection transistors GIDL_SST and SST may be applied to the selected first string selection line GIDL_SSL and the selected second string selection line SSL, and the turn-off voltage, that is, the ground voltage VSS, may be applied to the non-selected first string selection line GIDL_SSL and the non-selected second string selection line SSL.

The ground voltage VSS may be applied to the first ground selection line GIDL_GSL and the second ground selection line GSL, and the third precharge voltage VPC may be applied to the source line CSL. The third precharge voltage VPC level may be set lower than the second precharge voltage $V_{GIDL\_CSL}$ level, lower than the power voltage VDD level, and higher than the ground voltage VSS level.

At a completion time point Tb of the bit line setup period PBLS, the turn-on voltage VSSL1 of the selected first string selection line GIDL SSL and the selected second string selection line SSL may be maintained, and the turn-off voltage of the non-selected first string selection line GIDL_SSL and the non-selected second string selection line SSL may be maintained.

Thereafter, the operation from the program execution period PEXE to the verification read period RD may be performed in the same manner as in FIG. 7A.

Figure 8A:
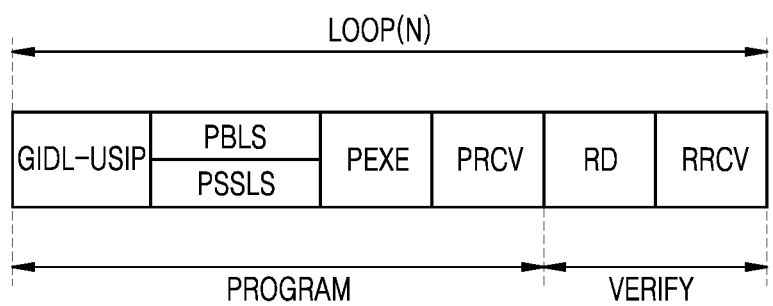
FIGS. 8A and 8B are diagrams illustrating operation periods included in program loops of a memory device according to example embodiments.
Figure 8B:
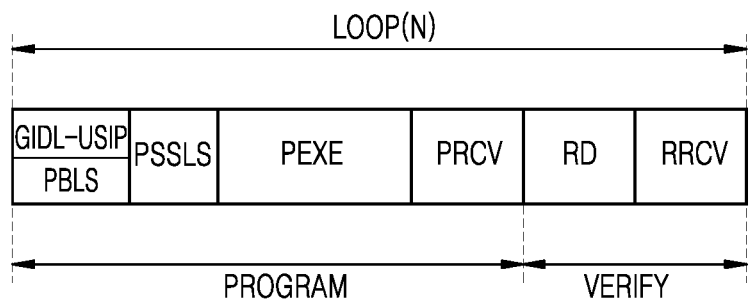

FIGS. 8A and 8B are diagrams illustrating operation periods included in program loops of a memory device according to example embodiments.

Referring to FIG. 8A, in the N-th program loop LOOP(N), as described in FIG. 7B, the program period PROGRAM may include the second channel precharge period GIDL-USIP, the bit line setup period PBLS, the string selection line setup period PSSLS, the program execution period PEXE, and the program recovery period PRCV, and the verification period VERIFY may include the verification read period RD and the read recovery period RRCV. The bit line setup period PBLS and the string selection line setup period PSSLS may be simultaneously performed in the program period PROGRAM.

Referring to FIG. 8B, in the N-th program loop LOOP(N), a second channel precharge period GIDL-USIP operation and a bit line setup period PBLS operation may be simultaneously performed in the program period PROGRAM. After the overlapped second channel precharge period GIDL-USIP and bit line setup period PBLS, the program period PROGRAM may include the string selection line setup period PSSLS, the program execution period PEXE, and the program recovery period PRCV, and the verification period VERIFY may include the verification read period RD and the read recovery period RRCV.

Various program bias conditions used to perform a channel precharge operation on cell strings irrespective of memory cells programmed in the program method of the memory device according to example embodiments of the inventive concept will be described in detail with reference to FIGS. 9 to 16.

FIGS. 9 to 16 are timing diagrams illustrating bias conditions of the second channel precharge period GIDL-USIP, the bit line setup period PBLS, and the string selection line setup period PSSLS included in program loops of a memory device according to example embodiments. Hereinafter, subscripts (e.g., 1 of Ta1 and 2 of Ta2) attached to reference numerals are used to distinguish a plurality of times having the same function. For convenience of explanation, a channel precharge operation performed on the bit line BL side according to a GIDL phenomenon induced from the first string selection transistor GIDL_SST is referred to as a first precharge operation 'USIP1', a channel precharge operation performed on the source line CSL side according to the GIDL phenomenon induced from the first ground selection transistor GIDL_GST referred to as a second precharge operation 'USIP2', a channel precharge operation performed on the source line CSL side through the first and second ground selection transistors GIDL_GST and GST referred to as a third precharge operation 'USIP3', and a channel precharge operation performed on the bit line BL side through the first and second string selection transistors GIDL_SST and SST is referred to as a fourth precharge operation 'USIP4'.

Figure 9:
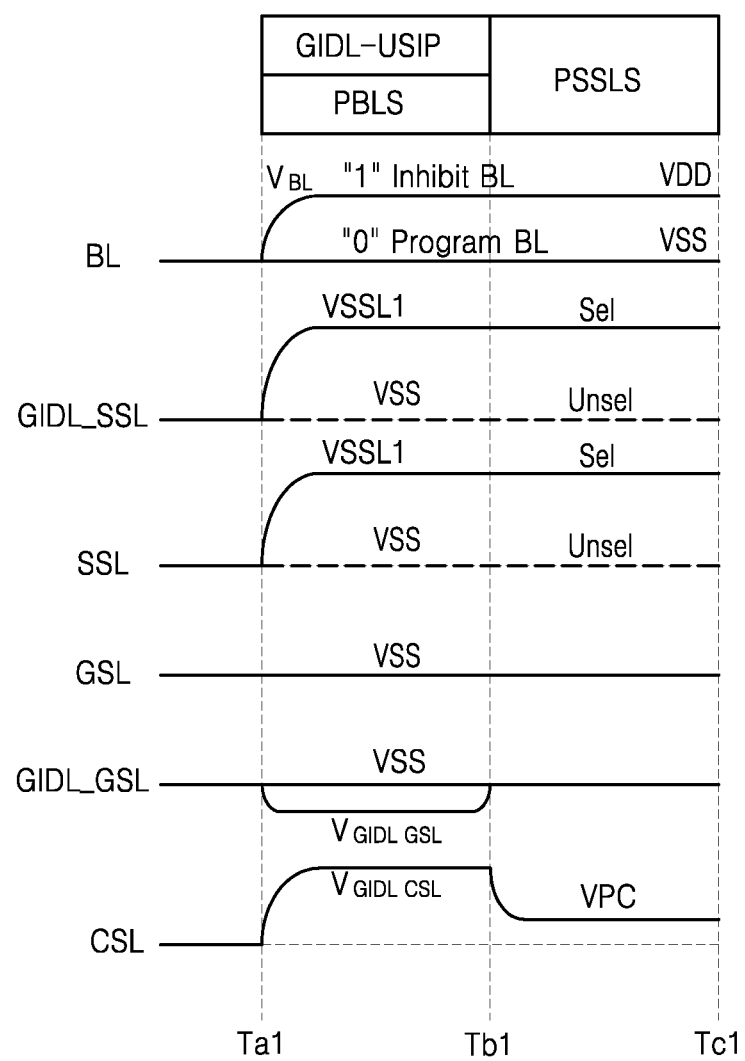
FIGS. 9 to 16 are timing diagrams illustrating bias conditions of a channel precharge period, a bit line setup period, and a string selection line setup period included in program loops of a memory device according to example embodiments.

Referring to FIG. 9 in connection with FIGS. 7B and 8B, the second channel precharge period GIDL-USIP and the bit line setup period PBLS overlap in the program loop PROGRAM, and then the string selection line setup period PSSLS follows.

At a start time point Ta1 of the second channel precharge period GIDL-USIP and the bit line setup period PBLS, a bit line voltage $V_{BL}$ may be applied to the bit line BL. The bit line voltage $V_{BL}$ of the power voltage VDD level, which is the program inhibition voltage level, may be applied to a program inhibition bit line, and the ground voltage VSS, which is a program permission voltage level, may be applied to a program permission bit line.

During the second channel precharge period GIDL-USIP and the bit line setup period PBLS, the turn-on voltage VSSL1 may be applied to the selected first string selection line GIDL_SSL and the selected second string selection line SSL, and the ground voltage VSS, which is a turn-off voltage, may be applied to the non-selected first string selection line GIDL_SSL and the non-selected second string selection line SSL. The second precharge voltage VGIDL CSL may be applied to the source line CSL, the second negative voltage $V_{GIDL\_GSL}$ or the ground voltage VSS may be applied to the first ground selection line GIDL_GSL, and the ground voltage VSS may be applied to the second ground selection line GSL. The channels of the plurality of cell strings may be USIP2 from the source line CSL side according to the GIDL phenomenon occurring in the first ground selection transistor GIDL_GST.

At a completion time point Tb1 of the second channel precharge period GIDL-USIP and the bit line setup period PBLS, that is, a start time point Tb1 of the string selection line setup period PSSLS, the bit line voltage $V_{BL}$ of the power voltage VDD level of the program inhibition bit line, the bit line voltage $V_{BL}$ of the ground voltage VSS level of the program permission bit line, and the turn-on voltage VSSL1 of the selected first string selection line GIDL SSL and the selected second string selection line SSL may be maintained, and the turn-off voltage of the non-selected first string selection line GIDL_SSL and the non-selected second string selection line SSL may be maintained. The ground voltage VSS may be applied to the first ground selection line GIDL_GSL, the ground voltage VSS of the second ground selection line GSL may be maintained, and the third precharge voltage VPC may be applied to the source line CSL.

In the program loop of FIG. 9, USIP2 is performed on the source line CSL side under a condition in which the bit line BL is fixed to the power voltage VDD level of the program inhibition bit line or the ground voltage VSS level of the program permission bit line, that is, under a 1-step bit line voltage condition. For example, a channel precharge operation may be performed on cell strings regardless of programmed memory cells.

Figure 10:
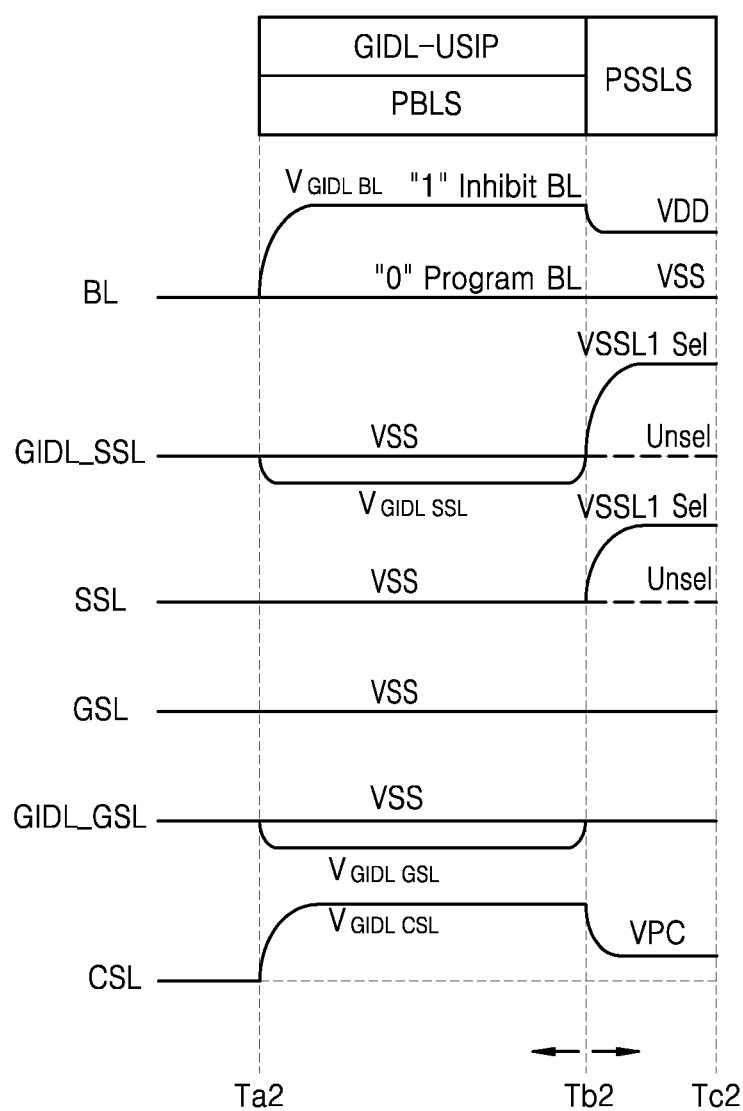

Referring to FIG. 10 in connection with FIGS. 7B and 8B, the second channel precharge period GIDL-USIP and the bit line setup period PBLS overlap in the program loop PROGRAM, and then the string selection line setup period PSSLS follows.

At a start time point Ta2 of the second channel precharge period GIDL-USIP and the bit line setup period PBLS, the first precharge voltage $V_{GIDL\ BL}$ higher than the power voltage VDD may be applied to the program inhibition bit line, and the ground voltage VSS, which is the program permission voltage level, may be applied to the program permission bit line.

During the second channel precharge period GIDL-USIP and the bit line setup period PBLS, the first negative voltage $V_{GIDL\ SSL}$ or the ground voltage VSS may be applied to the selected first string selection line GIDL_SSL, and the ground voltage VSS, which is the turn-off voltage, may be applied to the selected second string selection line SSL. The second precharge voltage VGIDL CSL may be applied to the source line CSL, the second negative voltage $V_{GIDL\ GSL}$ or the ground voltage VSS may be applied to the first ground selection line GIDL_GSL, and the ground voltage VSS may be applied to the second ground selection line GSL. The channel precharge operation of the plurality of cell strings may be USIP1 from the bit line BL side according to the GIDL phenomenon occurring in the first string selection transistor GIDL_SST, and may be USIP2 from the source line CSL side according to the GIDL phenomenon occurring in the first ground selection transistor GIDL_GST.

At a completion time point Tb2 of the second channel precharge period GIDL-USIP and the bit line setup period PBLS, that is, a start time point Tb2 of the string selection line setup period PSSLS, the program inhibition bit line may change from the first precharge voltage $V_{GIDL\ BL}$ level to the power voltage VDD level, and the ground voltage VSS level of the program-permission bit line may be maintained. The turn-on voltage VSSL1 may be applied to the selected first string selection line GIDL_SSL, and the turn-on voltage VSSL1 may be applied to the selected second string selection line SSL. The ground voltage VSS may be applied to the non-selected first string selection line GIDL_SSL, and the ground voltage VSS of the non-selected second string selection line SSL may be maintained The ground voltage VSS may be applied to the first ground selection line GIDL_GSL, the ground voltage VSS of the second ground selection line GSL may be maintained, and the third precharge voltage VPC may be applied to the source line CSL.

In the program loop of FIG. 10, the voltage of the bit line BL changes at the start time point Tb2 of the string selection line setup period PSSLS. In the bit line BL, the ground voltage VSS level of the program permission bit line is maintained, but the program inhibition bit line changes from the first precharge voltage $V_{GIDL\ BL}$ level to the power voltage VDD level. The time point at which the voltage of the bit line BL changes may vary depending on the number of program loops and/or the region of the selected word line. The time point at which the turn-on voltage VSSL1 is applied to the selected first string selection line GIDL_SSL and the selected second string selection line SSL may also vary according to the time point at which the voltage of the bit line BL changes. According to an embodiment, during the string selection line setup period PSSLS, the time point at which the voltage of the bit line BL changes may be set differently from the time point at which the source line CSL voltage changes so as to prevent conduction between the bit line BL and the source line CSL during the USIP2 operation of the source line CSL.

In the program loop of FIG. 10, USIP1 and USIP2 are performed in both directions of the bit line BL and the source line CSL under the condition in which the bit line BL voltage is the first precharge voltage $V_{GIDL\ BL}$ level of the program inhibition bit line or the ground voltage VSS level of the program permission bit line, that is, the 1-step bit line voltage condition. For example, a channel precharge operation may be performed on cell strings regardless of programmed memory cells.

Figure 11:
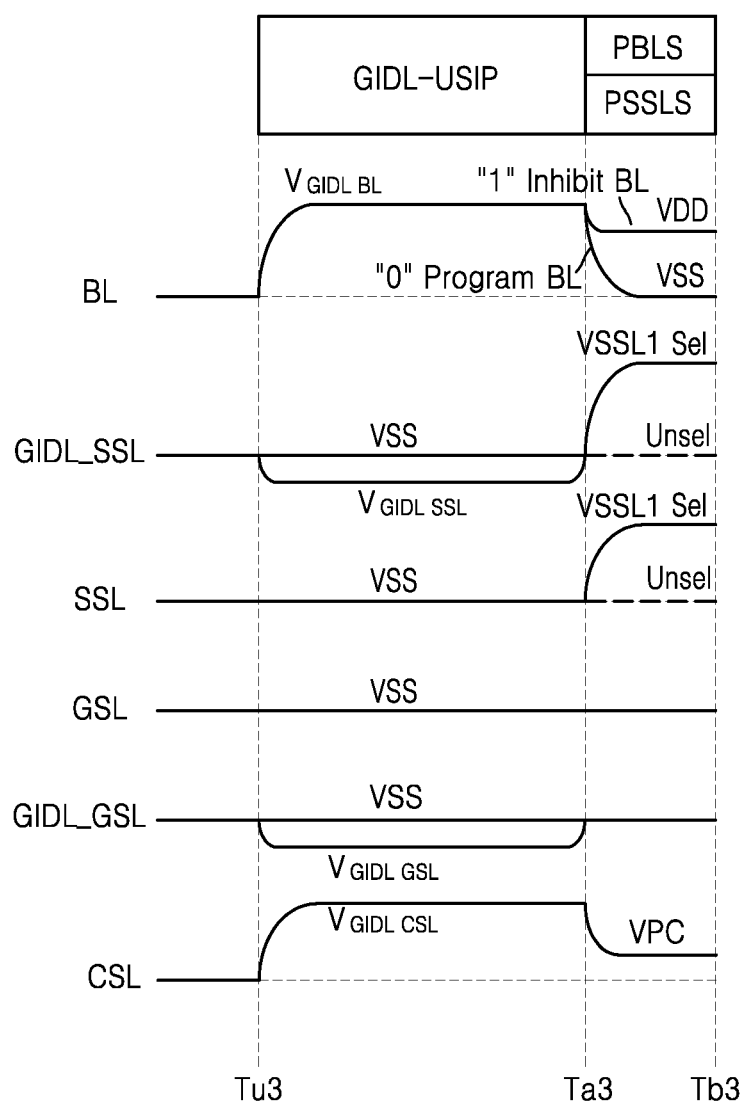

Referring to FIG. 11 in connection with FIGS. 7B and 8A, the bit line setup period PBLS follows after the second channel precharge period GIDL-USIP in the program loop PROGRAM.

At a start time Tu3 of the second channel precharge period GIDL-USIP, the first precharge voltage $V_{GIDL\ BL}$ higher than the power voltage VDD may be applied to the bit line BL.

During the second channel precharge period GIDL-USIP, the first negative voltage $V_{GIDL\ SSL}$ or the ground voltage VSS may be applied to the first string selection line GIDL_SSL and the ground voltage VSS, which is a turn-off voltage, may be applied to the second string selection line SSL. The second precharge voltage VGIDL CSL may be applied to the source line CSL, the second negative voltage $V_{GIDL\ GSL}$ or the ground voltage VSS may be applied to the first ground selection line GIDL_GSL, and the ground voltage VSS may be applied to the second ground selection line GSL. The channel precharge operation of the plurality of cell strings may be USIP1 from the bit line BL side according to the GIDL phenomenon occurring in the first string selection transistor GIDL_SST, and may be USIP2 from the source line CSL side according to the GIDL phenomenon occurring in the first ground selection transistor GIDL_GST.

At a completion time point Ta3 of the second channel precharge period GIDL-USIP, that is, a start time point Ta3 of the bit line setup period PBLS and the string selection line setup period PSSLS, the power voltage VDD may be applied to the program inhibition bit line, and the ground voltage VSS may be applied to the program permission bit line in the bit line BL. The turn-on voltage VSSL1 may be applied to the selected first string selection line GIDL_SSL and the selected second string selection line SSL. The ground voltage VSS may be applied to the non-selected first string selection line GIDL_SSL, and the ground voltage VSS of the non-selected second string selection line SSL may be maintained. The ground voltage VSS may be applied to the first ground selection line GIDL_GSL, the ground voltage VSS of the second ground selection line GSL may be maintained, and the third precharge voltage VPC may be applied to the source line CSL.

In the program loop of FIG. 11, USIP1 and USIP2 are performed in both directions of the bit line BL and the source line CSL under the condition in which the program inhibition bit line changes from the first precharge voltage $V_{GIDL\_BL}$ level to the power voltage VDD level, and the program permission bit line changes from the first precharge voltage $V_{GIDL\_BL}$ level to the ground voltage VSS, that is, a 2-step bit line voltage condition. For example, a channel precharge operation may be performed on cell strings regardless of programmed memory cells.

Figure 12:
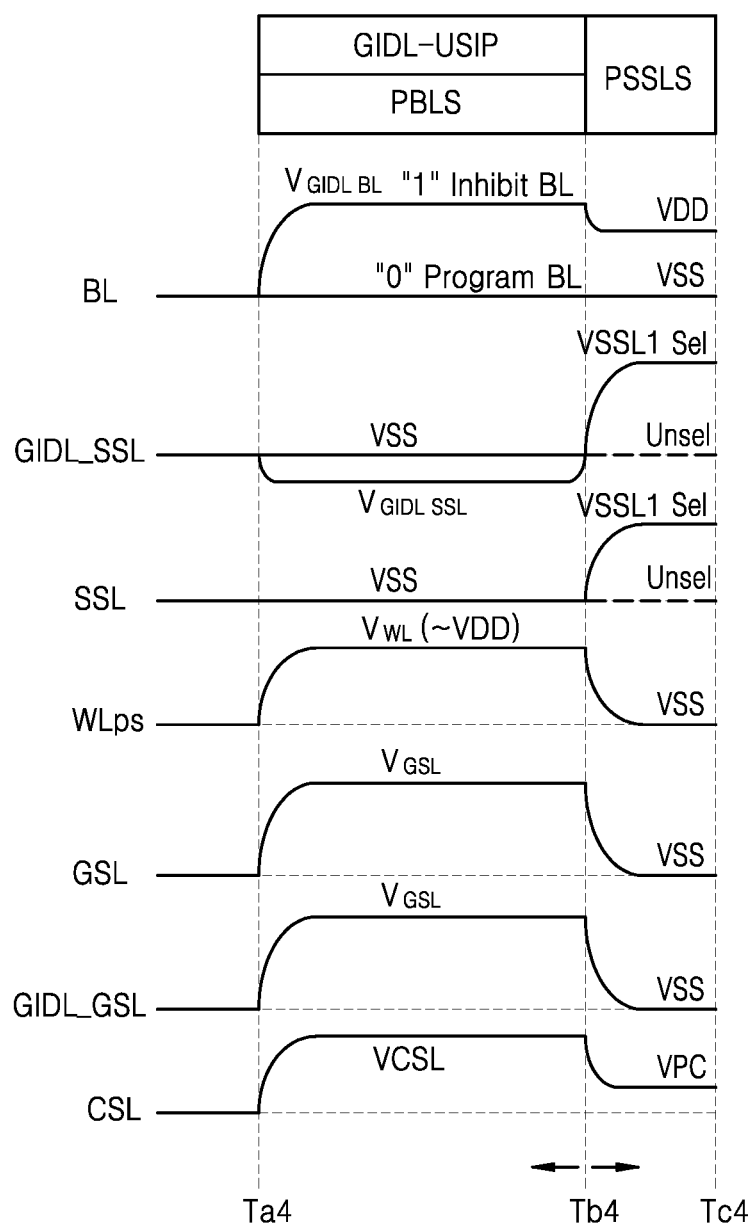

Referring to FIG. 12 in connection with FIGS. 7B and 8B, the second channel precharge period GIDL-USIP and the bit line setup period PBLS overlap in the program loop PROGRAM, and then the string selection line setup period PSSLS follows.

At a start time point Ta4 of the second channel precharge period GIDL-USIP and the bit line setup period PBLS, the first precharge voltage $V_{GIDL\_BL}$ higher than the power voltage VDD may be applied to the program inhibition bit line, and the ground voltage VSS, which is the program permission voltage level, may be applied to the program permission bit line in the bit line BL.

During the second channel precharge period GIDL-USIP and the bit line setup period PBLS, the first negative voltage $V_{GIDL\_SSL}$ or the ground voltage VSS may be applied to the selected first string selection line GIDL_SSL, and the ground voltage VSS, which is the turn-off voltage, may be applied to the selected second string selection line SSL. A word line voltage $V_{WL}$ of the power voltage VDD level may be applied to one or more word lines WLps of the programmed memory cells among the memory cells. The one or more word lines WLps of the programmed memory cells of the power voltage VDD level may be provided to prevent the conduction between the bit line BL and the source line CSL by USIP1 on the bit line BL side and USIP3 on the source line CSL side.

The positions and number of the one or more word lines WLps of programmed memory cells to which the word line voltage $V_{WL}$ of the power voltage VDD level is applied may vary. The memory cells to which the word line voltage $V_{WL}$ is applied among the programmed memory cells may change considering the gate length of the memory cell in the cell string. For example, as the gate length of the programmed memory cell decreases, the bit line BL and the source line CSL may be conducted to each other due to the short channel effect, and thus a conduction phenomenon may be prevented by varying the positions and number of the one or more word lines WLps of the programmed memory cells to which the word line voltage $V_{WL}$ is applied.

During the second channel precharge period GIDL-USIP and the bit line setup period PBLS, a fourth precharge voltage VCSL may be applied to the source line CSL, and a turn-on voltage VGSL may be applied to the first and second ground selection lines GIDL_GSL and GSL. The channel precharge operation of the plurality of cell strings may be USIP1 from the bit line BL side according to the GIDL phenomenon occurring in the first string selection transistor GIDL_SST, and may be USIP3 from the source line CSL side through the first and second ground selection transistors GIDL_GST and GST.

At a completion time point Tb4 of the second channel precharge period GIDL-USIP and the bit line setup period PBLS, that is, a start time point Tb4 of the string selection line setup period PSSLS, the program inhibition bit line may change from the first precharge voltage $V_{GIDL\_BL}$ level to the power voltage VDD level, and the ground voltage VSS level of the program-permission bit line may be maintained. The turn-on voltage VSSL1 may be applied to the selected first string selection line GIDL_SSL and the selected second string selection line SSL. The ground voltage VSS may be applied to the non-selected first string selection line GIDL_SSL, and the ground voltage VSS of the non-selected second string selection line SSL may be maintained. The ground voltage VSS may be applied to the one or more word lines WLps of the programmed memory cells. The ground voltage VSS, which is the turn-off voltage, may be applied to the first and second ground selection lines GIDL_GSL and GSL, and the third precharge voltage VPC may be applied to the source line CSL.

In the program loop of FIG. 12, the voltage of the bit line BL changes at the start time point Tb4 of the string selection line setup period PSSLS. In the bit line BL, the ground voltage VSS level of the program permission bit line is maintained, but the program inhibition bit line changes from the first precharge voltage $V_{GIDL\_BL}$ level to the power voltage VDD level. The time point at which the voltage of the bit line BL changes may vary depending on the number of program loops and/or the region of the selected word line. The time point at which the turn-on voltage VSSL1 is applied to the selected first string selection line GIDL_SSL and the selected second string selection line SSL may also vary according to the time point at which the voltage of the bit line BL changes. According to an embodiment, during the string selection line setup period PSSLS, the time point at which the voltage of the bit line BL changes may be set differently from the time point at which the source line CSL voltage changes so as to prevent conduction between the bit line BL and the source line CSL during the USIP3 operation of the source line CSL.

In the program loop of FIG. 12, USIP1 and the third precharge are performed in both directions of the bit line BL and the source line CSL under the condition in which the bit line BL voltage has the precharge voltages $V_{GIDL\_BL}$, that is, the 1-step bit line voltage condition. For example, a channel precharge operation may be performed on cell strings regardless of programmed memory cells.

Figure 13:
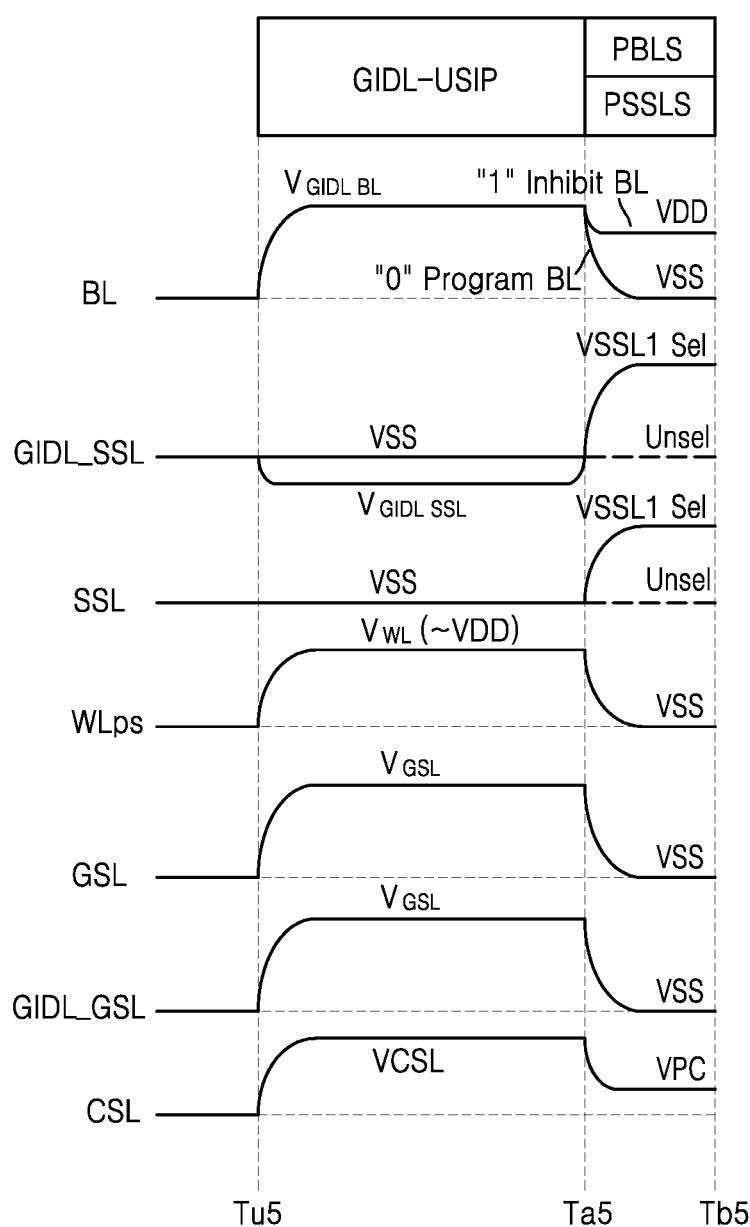

Referring to FIG. 13 in connection with FIGS. 7B and 8A, the bit line setup period PBLS follows after the second channel precharge period GIDL-USIP in the program loop PROGRAM.

At a start time point Tu5 of the second channel precharge period GIDL-USIP, the first precharge voltage $V_{GIDL\_BL}$ higher than the power voltage VDD may be applied to the bit line BL.

During the second channel precharge period GIDL-USIP, the first negative voltage $V_{GIDL\_SSL}$ or the ground voltage VSS may be applied to the first string selection line GIDL_SSL and the ground voltage VSS, which is a turn-off voltage, may be applied to the second string selection line SSL. The word line voltage $V_{WL}$ of the power voltage VDD level may be applied to the one or more word lines WLps of the programmed memory cells among the memory cells. The positions and number of the one or more word lines WLps of programmed memory cells to which the word line voltage $V_{WL}$ of the power voltage VDD level is applied may vary.

During the second channel precharge period GIDL-USIP, the fourth precharge voltage VCSL may be applied to the source line CSL, and the turn-on voltage VGSL may be applied to the first and second ground selection lines GIDL_GSL and GSL. The channel precharge operation of the plurality of cell strings may be USIP1 from the bit line BL side according to the GIDL phenomenon occurring in the first string selection transistor GIDL_SST, and may be USIP3 from the source line CSL side through the first and second ground selection transistors GIDL_GST and GST.

At a completion time point Ta5 of the second channel precharge period GIDL-USIP, that is, a start time point Ta5 of the bit line setup period PBLS and the string selection line setup period PSSLS, the power voltage VDD may be applied to the program inhibition bit line, and the ground voltage VSS may be applied to the program permission bit line in the bit line BL. The turn-on voltage VSSL1 may be applied to the selected first string selection line GIDL_SSL and the selected second string selection line SSL. The ground voltage VSS may be applied to the non-selected first string selection line GIDL_SSL, and the ground voltage VSS of the non-selected second string selection line SSL may be maintained. The ground voltage VSS may be applied to the one or more word lines WLps of the programmed memory cells. The ground voltage VSS, which is the turn-off voltage, may be applied to the first and second ground selection lines GIDL_GSL and GSL, and the third precharge voltage VPC may be applied to the source line CSL.

In the program loop of FIG. 13, USIP1 and USIP3 are performed in both directions of the bit line BL and the source line CSL under the condition in which the program inhibition bit line changes from the first precharge voltage $V_{GIDL\_BL}$ level to the power voltage VDD level, and the program permission bit line changes from the first precharge voltage $V_{GIDL\_BL}$ level to the ground voltage VSS, that is, the 2-step bit line voltage condition. For example, a channel precharge operation may be performed on cell strings regardless of programmed memory cells.

Figure 14:
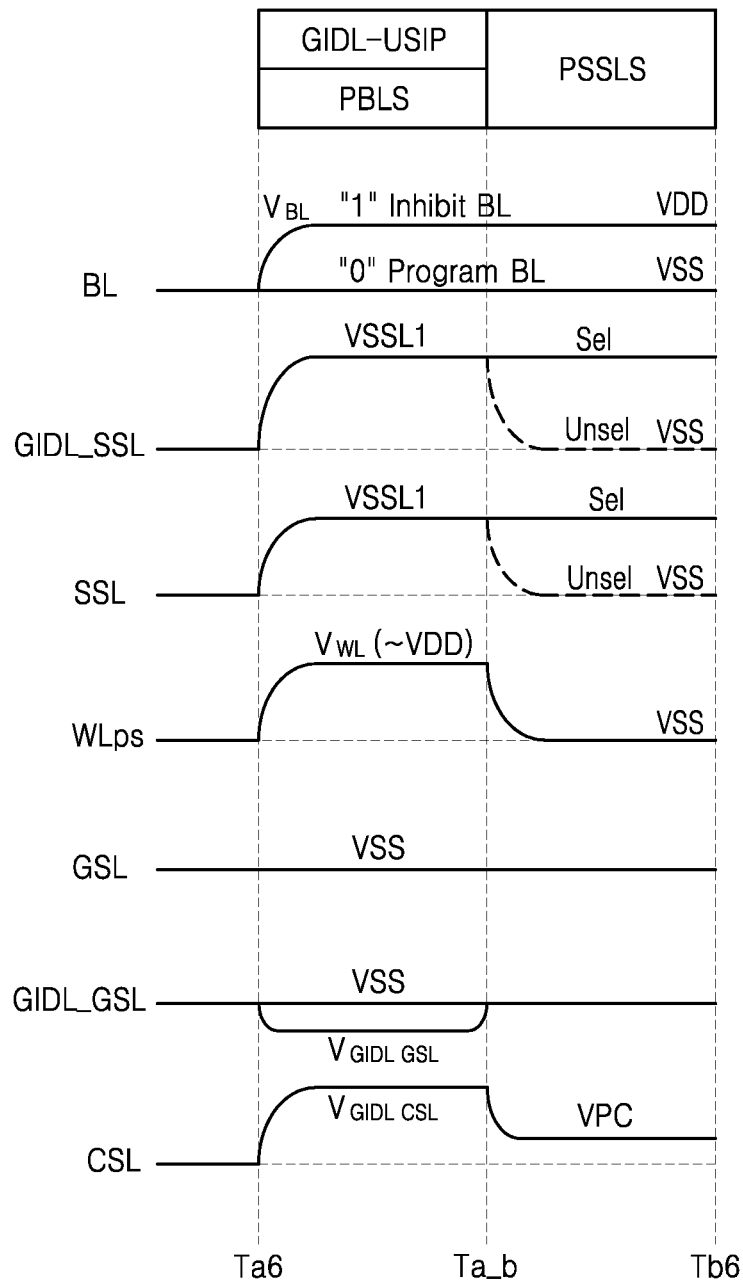

Referring to FIG. 14 in connection with FIGS. 7B and 8B, the second channel precharge period GIDL-USIP overlaps only until a middle time point Ta_b, that is, a start time point of the string selection line setup period PSSLS in the program loop PROGRAM.

At a start time point Ta6 of the second channel precharge period GIDL-USIP and the bit line setup period PBLS, the bit line voltage $V_{BL}$ may be applied to the bit line BL. The bit line voltage $V_{BL}$ of the power voltage VDD level, which is the program inhibition voltage level, may be applied to the program inhibition bit line, and the ground voltage VSS, which is the program permission voltage level, may be applied to the program permission bit line.

At the start time point Ta6 of the second channel precharge period GIDL-USIP and the bit line setup period PBLS, the turn-on voltage VSSL1 may be applied to the first and second string selection lines GIDL_SSL and SSL. The word line voltage $V_{WL}$ of the power voltage VDD level may be applied to one or more word lines WLps of the programmed memory cells among the memory cells. The positions and number of the one or more word lines WLps of programmed memory cells to which the word line voltage $V_{WL}$ of the power voltage VDD level is applied may vary. The second precharge voltage $V_{GIDL\_CSL}$ may be applied to the source line CSL, the second negative voltage $V_{GIDL\_GSL}$ or the ground voltage VSS may be applied to the first ground selection line GIDL_GSL, and the ground voltage VSS may be applied to the second ground selection line GSL. The channel precharge operation of the plurality of cell strings may be USIP4 from the bit line BL side through the first and second string selection transistors GIDL_SST and SST, and may be USIP2 from the source line CSL side according to the GIDL phenomenon occurring in the first ground selection transistor GIDL_GST.

At the middle time point Ta_b between the second channel precharge period GIDL-USIP and the string selection line setup period PSSLS, the turn-on voltage VSSL1 of the selected first string selection line GIDL SSL and the selected second string selection line SSL may be maintained, and the ground voltage VSS may be applied to the non-selected first string selection line GIDL SSL and the non-selected second string selection line SSL. The ground voltage VSS may be applied to the one or more word lines WLps of the programmed memory cells. The ground voltage VSS may be applied to the first ground selection line GIDL_GSL, the ground voltage VSS of the second ground selection line GSL may be maintained, and the third precharge voltage VPC may be applied to the source line CSL.

In the program loop of FIG. 14, USIP4 and USIP2 are performed in both directions of the bit line BL and the source line CSL under the condition in which the bit line BL is fixed to the power voltage VDD level of the program inhibition bit line or the ground voltage VSS level of the program permission bit line, that is, the 1-step bit line voltage condition. For example, a channel precharge operation may be performed on cell strings regardless of programmed memory cells.

Figure 15:
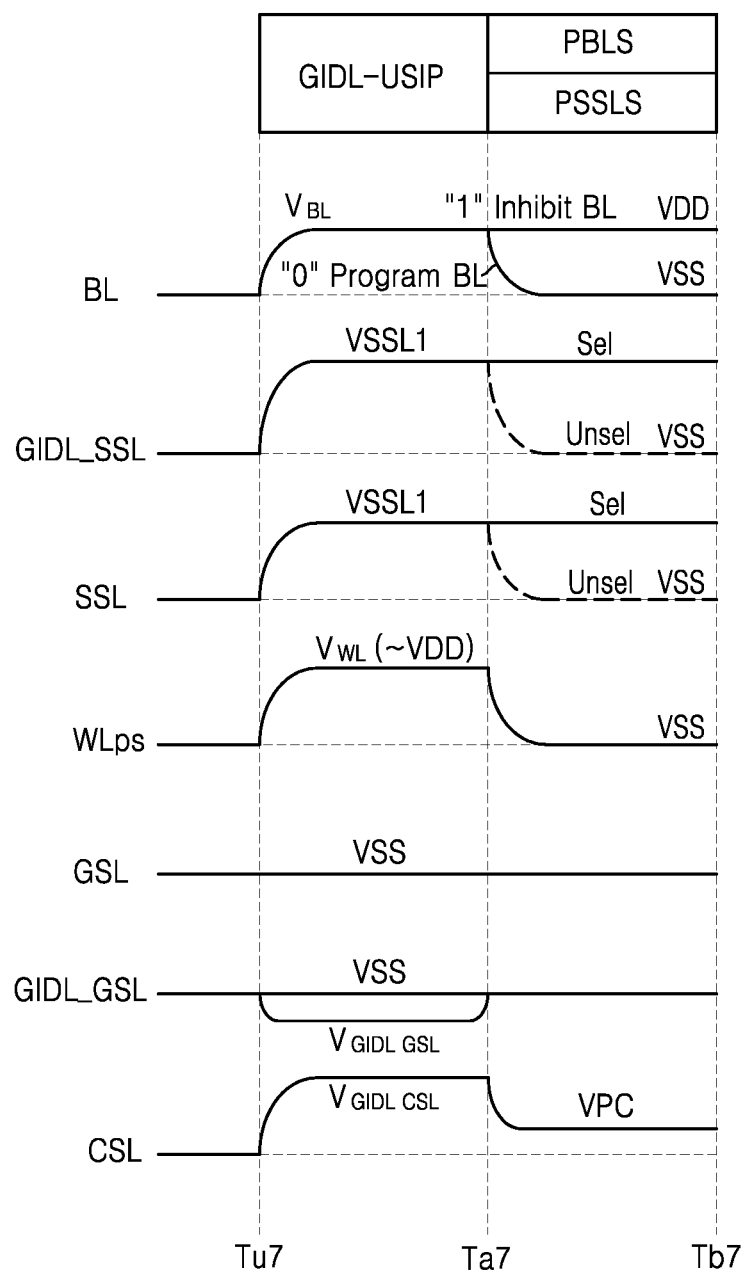

Referring to FIG. 15 in connection with FIGS. 7B and 8A, the bit line setup period PBLS follows after the second channel precharge period GIDL-USIP in the program loop PROGRAM.

At a start time point Tu7 of the second channel precharge period GIDL-USIP, the power voltage VDD may be applied to the bit line BL.

During the second channel precharge period GIDL-USIP, the turn-on voltage VSSL1 may be applied to the first and second string selection lines GIDL SSL and SSL. The word line voltage $V_{WL}$ of the power voltage VDD level may be applied to one or more word lines WLps of the programmed memory cells among the memory cells. The positions and number of the one or more word lines WLps of programmed memory cells to which the word line voltage $V_{WL}$ of the power voltage VDD level is applied may vary. The second precharge voltage $V_{GIDL\_CSL}$ may be applied to the source line CSL, the second negative voltage $V_{GIDL\_GSL}$ or the ground voltage VSS may be applied to the first ground selection line GIDL_GSL, and the ground voltage VSS may be applied to the second ground selection line GSL. The channel precharge operation of the plurality of cell strings may be USIP4 from the bit line BL side through the first and second string selection transistors GIDL_SST and SST, and may be USIP2 from the source line CSL side according to the GIDL phenomenon occurring in the first ground selection transistor GIDL_GST.

At a completion time point Ta7 of the second channel precharge period GIDL-USIP, that is, a start time point Ta7 of the bit line setup period PBLS and the string selection line setup period PSSLS, the power voltage VDD may be applied to the program inhibition bit line, and the ground voltage VSS may be applied to the program permission bit line in the bit line BL. The turn-on voltage VSSL1 of the selected first string selection line GIDL_SSL and the selected second string selection line SSL may be maintained, and the ground voltage VSS may be applied to the non-selected first string selection line GIDL_SSL and the non-selected second string selection line SSL. The ground voltage VSS may be applied to the one or more word lines WLps of the programmed memory cells. The ground voltage VSS may be applied to the first ground selection lines GIDL_GSL, the ground voltage VSS of the second ground selection line GSL may be maintained, and the third precharge voltage VPC may be applied to the source line CSL.

In the program loop of FIG. 15, USIP4 and USIP2 are performed in both directions of the bit line BL and the source line CSL under the condition in which the program inhibition bit line maintains the power voltage VDD level, and the program permission bit line changes from the power voltage VDD level to the ground voltage VSS level in the bit line BL to which the power voltage VDD is applied, that is, the 2-step bit line voltage condition. For example, a channel precharge operation may be performed on cell strings regardless of programmed memory cells.

Figure 16:
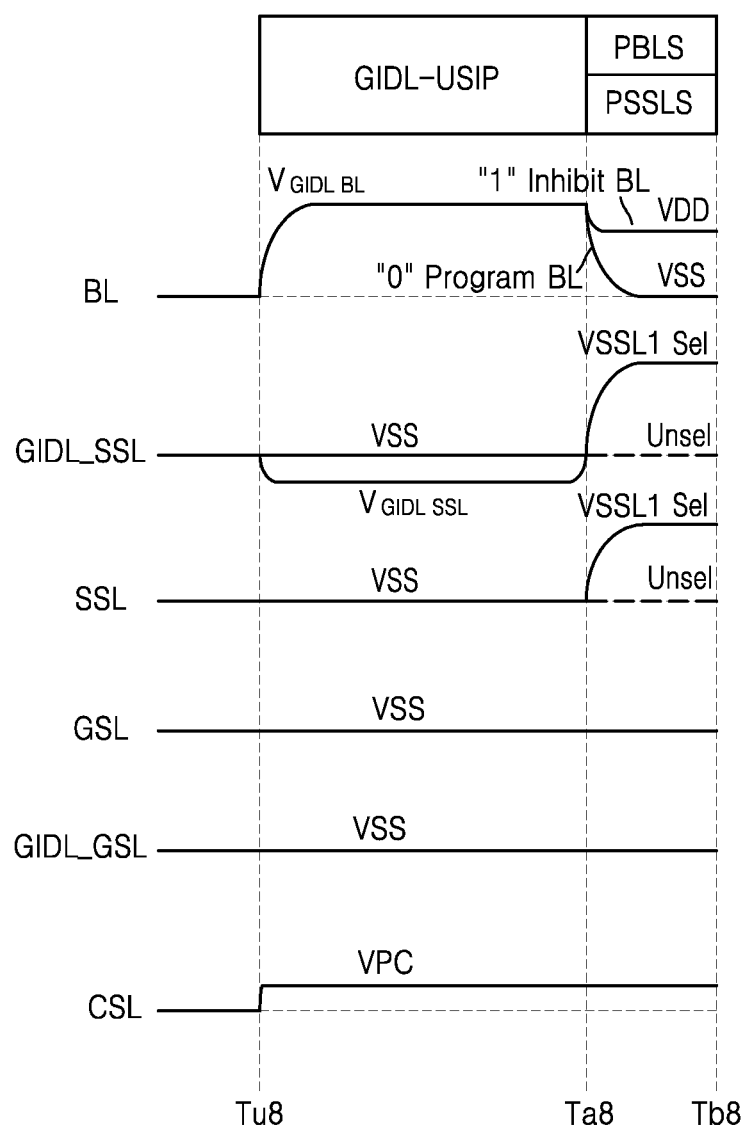

Referring to FIG. 16 in connection with FIGS. 7B and 8A, the bit line setup period PBLS follows after the second channel precharge period GIDL-USIP in the program loop PROGRAM.

At a start time Tub of the second channel precharge period GIDL-USIP, the first precharge voltage $V_{GIDL\_BL}$ higher than the power voltage VDD may be applied to the bit line BL.

During the second channel precharge period GIDL-USIP, the first negative voltage $V_{GIDL\_SSL}$ or the ground voltage VSS may be applied to the first string selection line GIDL_SSL and the ground voltage VSS, which is a turn-off voltage, may be applied to the second string selection line SSL. The third precharge voltage VPC may be applied to the source line CSL. The third precharge voltage VPC level may be set lower than the second precharge voltage $V_{GIDL\_CSL}$. The ground voltage VSS may be applied to the first ground selection line GIDL_GSL, and the ground voltage VSS may be applied to the second ground selection line GSL. The channel precharge operation of the plurality of cell strings may be USIP1 from the bit line BL side according to the GIDL phenomenon occurring in the first string selection transistor GIDL_SST.

At a completion time point Ta8 of the second channel precharge period GIDL-USIP, that is, a start time point Ta8 of the bit line setup period PBLS and the string selection line setup period PSSLS, the power voltage VDD may be applied to the program inhibition bit line, and the ground voltage VSS may be applied to the program permission bit line in the bit line BL. The turn-on voltage VSSL1 may be applied to the selected first string selection line GIDL_SSL and the selected second string selection line SSL. The ground voltage VSS may be applied to the non-selected first string selection line GIDL_SSL, and the ground voltage VSS of the non-selected second string selection line SSL may be maintained. The ground voltage VSS of the first and second ground selection lines GIDL_GSL and GSL may be maintained, and the third precharge voltage VPC of the source line CSL may be maintained.

In the program loop of FIG. 16, USIP1 is performed in the direction of the bit line BL under the condition in which the program inhibition bit line changes from the first precharge voltage $V_{GIDL\_BL}$ level to the power voltage VDD level, and the program permission bit line changes from the first precharge voltage $V_{GIDL\_BL}$ level to the ground voltage VSS, that is, the 2-step bit line voltage condition. For example, a channel precharge operation may be performed on cell strings regardless of programmed memory cells.

Figure 17:
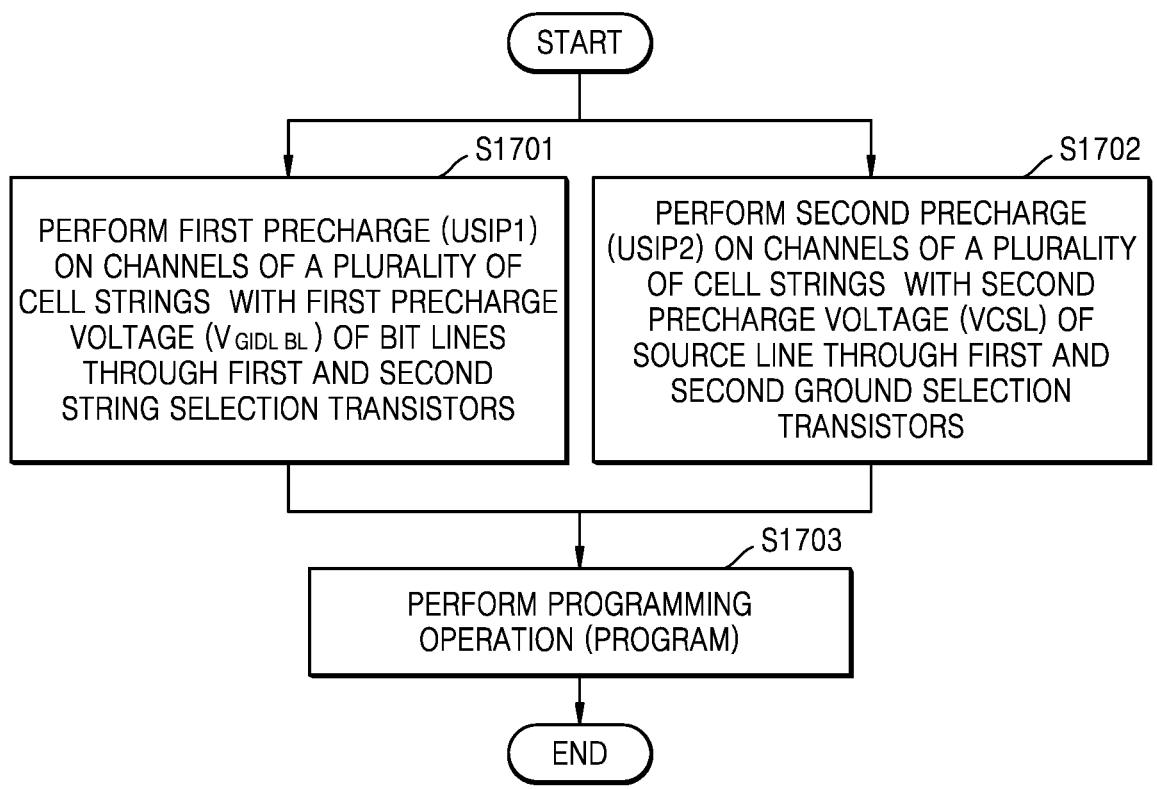
FIG. 17 is a flowchart illustrating a program method of a memory device according to example embodiments.

FIG. 17 is a flowchart illustrating a program method of a memory device according to example embodiments.

Referring to FIG. 17, in the program method of the memory device, the first precharge operation USIP1 and the second precharge operation USIP2 may be simultaneously performed, and then the program operation PROGRAM may be performed. In the first precharge operation USIP1, channels of a plurality of cell strings are first precharged at the first precharge voltage $V_{GIDL\_BL}$ of the bit line BL through the first and second string selection transistors GIDL_SST and SST (S1701). The first precharge voltage $V_{GIDL\_BL}$ level is higher than the power voltage VDD level. The channels of the plurality of cell strings may be initialized on the bit line BL side according to the GIDL phenomenon occurring in the first string selection transistor GIDL_SST.

In the first precharge operation USIP1, first precharge of the plurality of cell strings may be performed during the second channel precharge period GIDL-USIP or the bit line setup period PBLS under a bias condition in which the first precharge voltage $V_{GIDL\_BL}$ is applied to the program inhibition bit line, the program permission voltage VPER is applied to the program permission bit line, the first negative voltage $V_{GIDL\_SSL}$ or the ground voltage VSS is applied to the first string selection line GIDL_SSL, and the ground voltage VSS is applied to the second string selection line SSL in the bit line BL (FIGS. 10 and 12).

In the first precharge operation USIP1, first precharge of the plurality of cell strings may be performed during the second channel precharge period GIDL-USIP or the bit line setup period PBLS under a bias condition in which the first precharge voltage $V_{GIDL\_BL}$ is applied to the bit line BL, the second negative voltage $V_{GIDL\_GSL}$ or the ground voltage VSS is applied to the first ground selection line GIDL_GSL and the ground voltage VSS is applied to the second ground selection line GSL (FIGS. 11, 13, and 16).

In the second precharge operation USIP2, second precharge of the plurality of cell strings may be performed during the second channel precharge period GIDL-USIP or the bit line setup period PBLS under a bias condition in which the program inhibition voltage VINH level is applied to the program inhibition bit line, the program permission voltage VPER is applied to the program permission bit line, and the turn-on voltage VSSL1 is applied to the first and second string selection lines GIDL_SSL and SSL in the bit line BL (FIG. 14).

In the second precharge operation USIP2, second precharge of the plurality of cell strings may be performed during the second channel precharge period GIDL-USIP or the bit line setup period PBLS under a bias condition in which the program inhibition voltage VINH level is applied to the bit line BL, and the turn-on voltage VSSL1 is applied to the first and second string selection lines GIDL_SSL and SSL (FIG. 15).

In the second precharge operation USIP2, the channels of the plurality of cell strings are second precharged at the second precharge voltage $V_{GIDL\_CSL}$ or the third precharge voltage VPC of the source line CSL through the first and second ground selection transistors GIDL_GST and GST (S1702). The second precharge voltage $V_{GIDL\_CSL}$ level is higher than the power voltage VDD level. The channels of the plurality of cell strings may be initialized on the source line CSL side according to the GIDL phenomenon occurring in the first ground selection transistor GIDL_GST (FIGS. 9, 10, 11, 14, and 15).

In the second precharge operation USIP2, second precharge of the plurality of cell strings may be performed under a bias condition in which the second precharge voltage $V_{GIDL\_CSL}$ is applied to the source line CSL, the second negative voltage $V_{GIDL\_GSL}$ or the ground voltage VSS is applied to the first ground selection line GIDL_GSL, and the ground voltage VSS is applied to the second ground selection line GSL (FIGS. 9, 10, 11, 14, and 15).

In the third precharge operation USIP3, third precharge of the plurality of cell strings may be performed under a bias condition in which the second precharge voltage $V_{GIDL\_CSL}$ is applied to the source line CSL, and the turn-on voltage VGSL is applied to the first and second ground selection lines GIDL_GSL and GSL (FIGS. 12 and 13).

In the program operation PROGRAM, as described in the program execution period PEXE of FIG. 7B, memory cells connected to the selected word line WLs of a selected cell string may be programmed according to the setup voltage of the bit line BL under a bias condition in which the bit line BL is set up at the program inhibition voltage VINH or the program permission voltage VPER according to the value of write data, the program pass voltage VPASS1 is applied to the selected word line WLs and the non-selected word lines WLu, after a certain period of time has elapsed, the program voltage VPGM is applied to the selected word line WLs, the turn-on voltage VSSL1 is applied to the selected first string selection line GIDL_SSL and the selected second string selection line SSL, and the ground voltage VSS is applied to the non-selected first string selection line GIDL_SSL and the non-selected second string selection line SSL.

FIGS. 18A to 18C are diagrams illustrating a state of a sub-block in a memory block during a program operation of a memory device according to example embodiments.

Referring to FIG. 18A, one memory block BLK may be divided into, for example, two sub-blocks SB1 and SB2. The dividing criterion of sub-blocks may be a middle switching line MSL on a boundary layer BND. The boundary layer BND may correspond to a stopper layer for forming a first sub-channel hole 1801 and a second sub-channel hole 1802 constituting channel holes of a cell string NS step by step. Because cells of the stopper layer are not suitable for storing data, this stopper layer may be used as the boundary layer BND for forming middle switching transistors. One or more gate line layers adjacent to each other in the vertical direction may be formed on the boundary layer BND, and this gate line may be referred to as the middle switching line MSL.

The program order of the sub-blocks SB1 and SB2 may be ① from the bit line BL to the middle switching line MSL, and from the middle switching line MSL to the source line CSL, ② from the source line CSL to the middle switching line MSL, and from the middle switching line MSL to the bit line BL, ③ from the middle switching line MSL to the bit line BL and the source line CSL, or ④ from the bit line BL and the source line CSL to the middle switching line MSL.

Referring to FIG. 18B, it is assumed that according to the program order of FIG. 18A, in the cell string NS, from a memory cell adjacent to the bit line BL to a memory cell connected to an arbitrary word line WLp among memory cells corresponding to the first sub-block SB1 are programmed and all memory cells corresponding to the second sub-block SB2 are programmed. Some of channels corresponding to the programmed memory cells on the bit line BL side of the first sub-block SB1 may be negatively boosted, and the USIP operation on the cell string NS may not be possible due to a high threshold voltage of the programmed memory cells. In addition, some of channels corresponding to the programmed memory cells on the source line CSL side of the second sub-block SB2 may be negatively boosted, and the USIP operation on the cell string NS may not be possible due to a high threshold voltage of the programmed memory cells.

In order to solve incomplete channel initialization that occurs during a program operation of a sub-block unit in a memory block, the program method of the present disclosure may initialize the channels of the cell string NS by simultaneously performing a channel precharge operation on the bit line BL side through the first precharge operation USIP1 of FIG. 17 and a channel precharge operation on the source line CSL side through the second precharge operation USIP2 of FIG. 17. The first precharge operation USIP1 on the bit line BL side may be performed on a channel corresponding to the arbitrary word line WLp of the programmed memory cells to which the power voltage VDD level is applied, thereby preventing conduction between the bit line BL and the source line are CSL.

Referring to FIG. 18C, in the cell string NS, it is assumed that all memory cells corresponding to the second sub-block SB2 are programmed and from a memory cell adjacent to the middle switching line MSL to a memory cell connected to the arbitrary word line WLp among the memory cells corresponding to the first sub-block SB1 are programmed. In this case, the channels of the cell strings may be initialized by simultaneously performing the channel precharge operation on the bit line BL side through the first precharge operation USIP1 of FIG. 17 and the channel precharge operation on the source line CSL side through the second precharge operation USIP2 of FIG. 17. The second precharge operation USIP2 may be performed on the channel corresponding to the arbitrary word line WLp of the programmed memory cells to which the power voltage VDD level is applied from the source line CSL side thereby preventing conduction between the bit line BL and the source line are CSL.

Figure 19A:
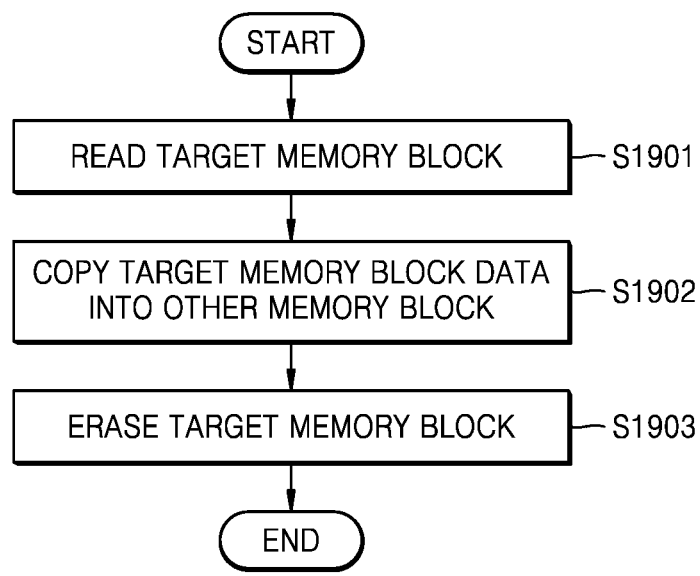
FIGS. 19A and 19B are diagrams conceptually illustrating a relationship between a program operation and a read reclaim operation of a memory device according to example embodiments.
Figure 19B:
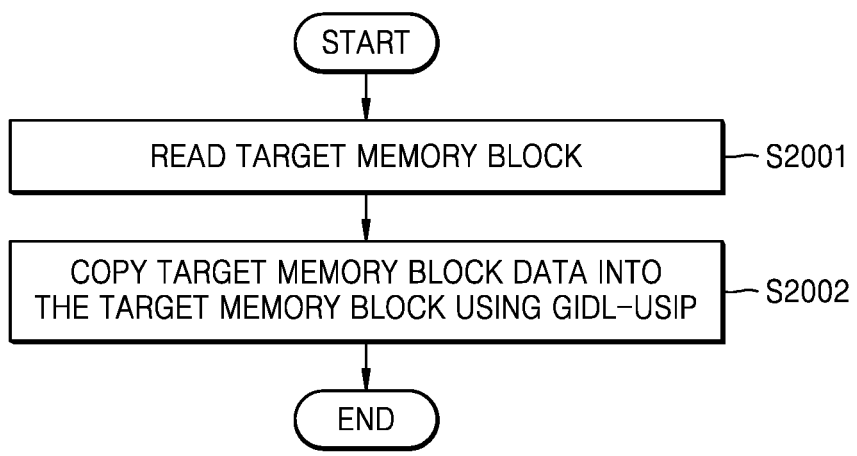

FIGS. 19A and 19B are diagrams conceptually illustrating a relationship between a program operation and a read reclaim operation of a memory device according to example embodiments. FIG. 19A illustrates a read reclaim when the program method of FIG. 17 is not applied, and FIG. 19B illustrates a read reclaim when the program method of FIG. 17 is applied.

Referring to FIGS. 1 and 19A, the memory controller 110 determines whether an error exists in data read during a read operation of the memory device 120 (S1901). When the error exists in a memory block (e.g., a target memory block) including a target region, error correction is performed by an error correction code (ECC). Meanwhile, there may be cases where error correction is impossible by the ECC. At this time, the read reclaim may be performed to overcome an error correction impossibility. The read reclaim may be conducted based on degradation information. The degradation information may be a program/erase (P/E) cycle, an erase count, a program count, a read count, a wear level count, an elapse time, an operation temperature, and the like.

The memory controller 110 may duplicate convex data corresponding to the target memory block and write the convex data to another memory block (S1902). The memory controller 110 may erase the target memory block (S1903).

Referring to FIG. 19B, when the memory controller 110 determines the error with respect to the data read from the target memory block (S2001), the memory controller 110 may duplicate the data on which ECC is performed to the corresponding target memory block (S2002). In this case, the memory device 120 may perform duplication to the target memory block using a program method including the second channel precharge interval GIDL-USIP described with reference to FIGS. 5, 6, 7A, 7B, 8A, 8B, 9 to 16, 17, 18A to 18C. For example, the memory controller 110 may duplicate the data to the corresponding target memory block during the read reclaim. Accordingly, the memory controller 110 may secure an available memory block resource.

Figure 20:
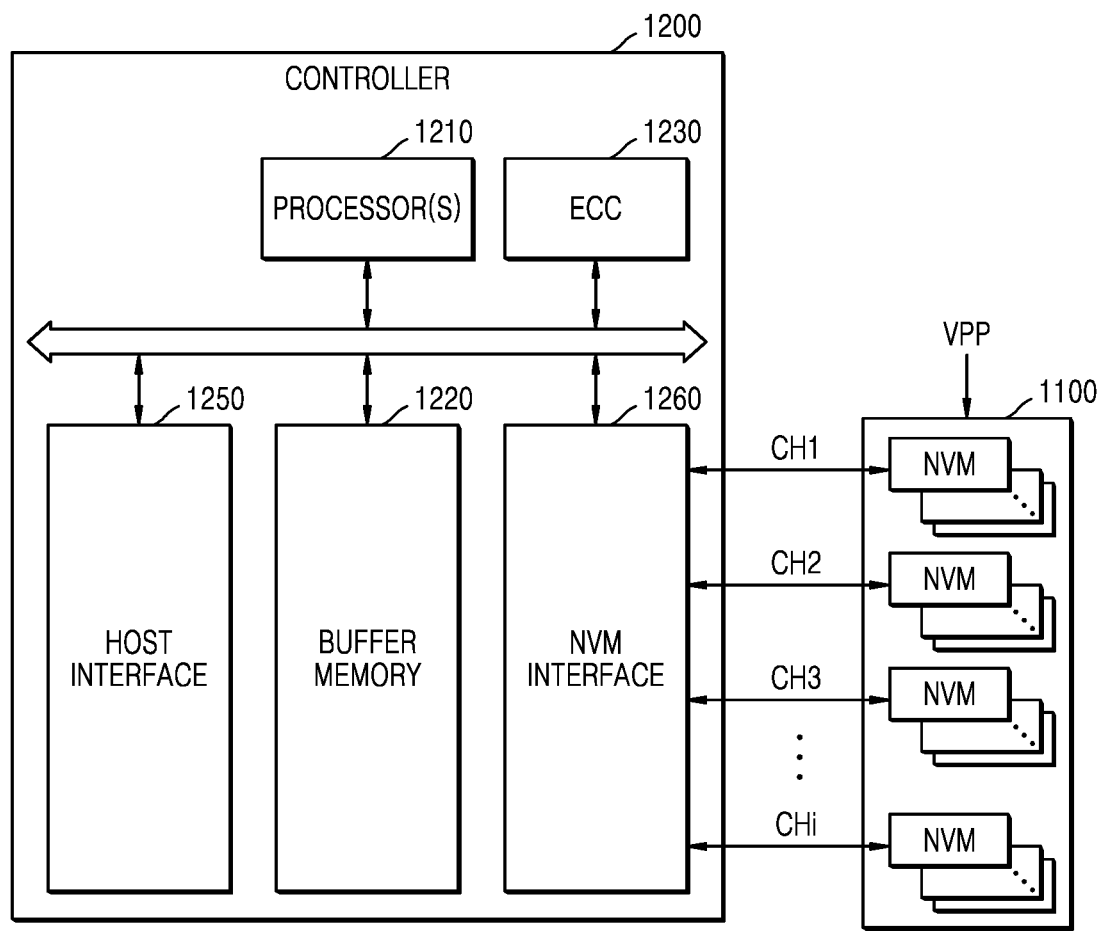
FIG. 20 is a block diagram illustrating a solid state drive or a solid state disk (SSD) performing a program method of a memory device according to example embodiments.

FIG. 20 is a block diagram illustrating a solid state drive or a solid state disk (SSD) 1000 performing a program method of a memory device according to example embodiments.

Referring to FIG. 20, the SSD 1000 includes a plurality of nonvolatile memory devices 1100 and an SSD controller 1200. The nonvolatile memory devices 1100 may be implemented as the above-described memory device 120. The nonvolatile memory devices 1100 may perform an operation of initializing channels with respect to a plurality of cell strings, and may perform a program operation on a selected memory cell among the plurality of memory cells. The operation of initializing the channels may perform a first precharge on a bit line side, a second precharge on a source line side, and simultaneously perform the first precharge and the second precharge.

The SSD controller 1200 is connected to the nonvolatile memory devices 1100 through a plurality of channels CH1 to CH4. The SSD controller 1200 includes at least one processor 1210, a buffer memory 1220, an ECC circuit 1230, a host interface 1250, and a nonvolatile memory interface 1260. The buffer memory 1220 may temporarily store data necessary for driving the SSD controller 1200. Also, the buffer memory 1220 may buffer data to be used for the program operation upon a write request. The ECC circuit 1230 calculates an error correction code value of data to be programmed in a write operation, corrects data read in a read operation based on an error correction code value, and corrects the nonvolatile memory devices 1100 in a read reclaim operation.

While the present disclosure has been particularly shown and described with reference to embodiments thereof, it will be understood that various changes in form and details may be made therein without departing from the invention of the following claims.

What is claimed is:

1. A program method of a nonvolatile memory device comprising a plurality of cell strings connected between a plurality of bit lines and a source line, each cell string comprising a first string selection transistor, a second string selection transistor, a plurality of memory cells, a second ground selection transistor, and a first ground selection transistor being arranged in series between a bit line and the source line, the program method comprising:
    initializing channels with respect to the plurality of cell strings; and
    performing a program operation on a selected memory cell among the plurality of memory cells, wherein the initializing of the channels comprises:
    performing a first precharge on the channels of the plurality of cell strings, using a first precharge voltage applied to the plurality of bit lines, through the first and second string selection transistors;
    performing a second precharge on the channels of the plurality of cell strings, using a second precharge voltage applied to the source line, through the first and second ground selection transistors;
    applying a ground voltage or a first negative voltage lower than the ground voltage to a first string selection line connected to the first string selection transistor;
    applying the ground voltage to a second string selection line connected to the second string selection transistor;
    applying the ground voltage to a second ground selection line connected to the second ground selection transistor; and
    applying the ground voltage or a second negative voltage lower than the ground voltage to a first ground selection line connected to the first ground selection transistor, wherein the first precharge is performed simultaneously with the second precharge.

2. The program method of claim 1, further comprising:
    before the performing of the program operation, setting up the bit lines by:
    applying a program inhibition voltage to a program inhibition bit line of the plurality of bit lines, the program inhibition bit line being a bit line for an unselected memory cell among the plurality of memory cells, and
    applying a program permission voltage to a program permission bit line of the plurality of bit lines, the program permission bit line being a bit line for the selected memory cell,
    wherein the program inhibition voltage is a power voltage applied to the nonvolatile memory device and the program permission voltage is the ground voltage, and
    wherein the power voltage is greater than the ground voltage.

3. The program method of claim 2, wherein the initializing of the channels is performed before the setting up of the bit lines, and further comprising:
    applying a turn-on voltage to a selected first string selection line of the selected memory cell; and
    applying the turn-on voltage to a selected second string selection line of the selected memory cell,
    wherein the turn-on voltage is greater than the ground voltage.

4. The program method of claim 3, further comprising:
    changing the voltage applied to the first ground selection line from the second negative voltage to the ground voltage; and
    changing the voltage applied to the source line from a second precharge voltage to a third precharge voltage lower than the second precharge voltage.

5. The program method of claim 2, wherein the initializing of the channels is performed before the setting up of the bit lines,
    wherein the initializing of the channels comprises:
    applying the first precharge voltage to the program inhibition bit line and the program permission bit line, the first precharge voltage being higher than the program inhibition voltage; and
    applying the second precharge voltage higher than a power voltage applied to the nonvolatile memory device to the source line, and
    wherein the setting up of the bit lines comprises:
    changing the first precharge voltage to the program inhibition voltage and the program permission voltage; and
    applying the program inhibition voltage to the program inhibition bit line and applying the program permission voltage to the program permission bit line, and
    wherein the power voltage is greater than the ground voltage.

6. The program method of claim 5, wherein a voltage change time of the program inhibition bit line varies according to the number of program loops or a region of a selected word line connected to the selected memory cell.

7. The program method of claim 5, further comprising:
    applying a turn-on voltage to a selected first string selection line and a selected second string selection line of the selected memory cell at a voltage change time of the program inhibition bit line,
wherein the turn-on voltage is greater than the ground voltage.

8. The program method of claim 5, further comprising:
changing the voltage applied to the first ground selection line from the second negative voltage to the ground voltage; and
changing the voltage applied to the source line from the second precharge voltage to a third precharge voltage lower than the second precharge voltage,
wherein a voltage change time of the source line is set differently from a voltage change time of the program inhibition bit line.

9. The program method of claim 2, wherein the setting up of the bit lines is performed after the initializing of the channels, and
wherein the initializing of the channels comprises:
applying the first precharge voltage higher than a power voltage applied to the nonvolatile memory device to the program inhibition bit line and the program permission bit line; and
applying the second precharge voltage higher than the power voltage to the source line,
wherein the power voltage is greater than the ground voltage.

10. The program method of claim 9, wherein the setting up of the bit lines comprises:
changing a voltage applied to a selected first string selection line of the selected memory cell from the first negative voltage or the ground voltage to a turn-on voltage;
changing a voltage applied to a selected second string selection line of the selected memory cell from the ground voltage to the turn-on voltage;
changing the voltage applied to the first ground selection line from the second negative voltage to the ground voltage; and
changing the voltage applied to the source line from the second precharge voltage to a third precharge voltage lower than the second precharge voltage,
wherein the turn-on voltage is greater than the ground voltage.

11. The program method of claim 2, wherein the setting up of the bit lines is performed after the initializing of the channels, and
wherein the initializing of the channels comprises:
applying the first precharge voltage to the program inhibition bit line and the program permission bit line; and
applying a third precharge voltage lower than the second precharge voltage to the source line.

12. The program method of claim 11, wherein the setting up of the bit lines comprises:
changing a voltage applied to a selected first string selection line of the selected memory cell from the first negative voltage or the ground voltage to a turn-on voltage; and
changing a voltage applied to a selected second string selection line of the selected memory cell from the ground voltage to the turn-on voltage,
wherein the turn-on voltage is greater than the ground voltage.

13. The program method of claim 1, wherein the first precharge voltage and the second precharge voltage are higher than a power voltage applied to the nonvolatile memory device, and
wherein the power voltage is greater than the ground voltage.

14. A program method of a nonvolatile memory device comprising a plurality of cell strings connected between a plurality of bit lines and a source line, each cell string comprising a first string selection transistor, a second string selection transistor, a plurality of memory cells, a second ground selection transistor, and a first ground selection transistor being arranged in series between a bit line and the source line, the program method comprising:
initializing channels with respect to the plurality of cell strings; and
performing a program operation on a selected memory cell among the plurality of memory cells, wherein the initializing of the channels comprises:
applying a word line voltage having a power voltage applied to the nonvolatile memory device to one or more word lines of programmed memory cells among the plurality of memory cells;
performing a first precharge on the channels of the plurality of cell strings, using a first precharge voltage applied to the plurality of bit lines, through the first and second string selection transistors; and
performing a second precharge on the channels of the plurality of cell strings, using a second precharge voltage applied to the source line, through the first and second ground selection transistors,
wherein the first precharge is performed simultaneously with the second precharge, and
wherein the power voltage is greater than a ground voltage, and the first precharge voltage and the second precharge voltage are greater than the power voltage.

15. The program method of claim 14, wherein positions and the number of the word lines of the programmed memory cells vary based on lengths of the initialized channels.

16. A nonvolatile memory device comprising: a memory cell array comprising a plurality of cell strings connected between a plurality of bit lines and a source line, each cell string comprising a first string selection transistor, a second string selection transistor, a plurality of memory cells, a second ground selection transistor, and a first ground selection transistor being arranged in series between a bit line and the source line; and
a control circuit configured to perform an operation of initializing channels with respect to the plurality of cell strings and a program operation on a selected memory cell among the plurality of memory cells,
wherein the control circuit is configured, in the operation of initializing the channels, to:
perform a first precharge on the channels of the plurality of cell strings, using a first precharge voltage applied to the plurality of bit lines, through the first and second string selection transistors; and
simultaneously perform a second precharge with the first precharge on the channels of the plurality of cell strings, using a second precharge voltage applied to the source line, through the first and second ground selection transistors,
wherein the first precharge voltage and the second precharge voltage are greater than a power voltage applied to the nonvolatile memory device, and
wherein the power voltage is greater than the ground voltage.

17. The nonvolatile memory device of claim 16, wherein the control circuit is further configured to apply a word line voltage having the power voltage to one or more word lines of programmed memory cells among the plurality of memory cells in the operation of initializing the channels.

18. The nonvolatile memory device of claim 16, wherein the memory cell array comprises a plurality of memory blocks each comprising the plurality of cell strings formed in a direction perpendicular to a substrate, and
wherein the control circuit is further configured to divide a memory block into a plurality of sub-blocks, perform the first precharge on a bit line side of the sub-blocks, and perform the second precharge on a source line side of the sub-blocks.

19. The nonvolatile memory device of claim 16, wherein the memory cell array comprises a plurality of memory blocks comprising the plurality of cell strings formed in a direction perpendicular to a substrate, and
wherein the control circuit is further configured to correct an error of data read from a target memory block, and to duplicate the error corrected data to the target memory block.

20. The nonvolatile memory device of claim 16, wherein the control circuit is further configured to perform the first precharge under a bias condition in which a ground voltage or a first negative voltage lower than the ground voltage is applied to a first string selection line connected to the first string selection transistor, and the ground voltage is applied to a second string selection line connected to the second string selection transistor.

* * * * *